(12) United States Patent
Ishiyama et al.

(10) Patent No.: US 9,935,165 B2
(45) Date of Patent: Apr. 3, 2018

(54) SEMICONDUCTOR DEVICE, DISPLAY UNIT, METHOD OF MANUFACTURING DISPLAY UNIT, AND ELECTRONIC APPARATUS

(71) Applicant: JOLED INC., Chiyoda-ku (JP)

(72) Inventors: Yuichiro Ishiyama, Tokyo (JP); Yuichi Kato, Tokyo (JP); Tomoatsu Kinoshita, Tokyo (JP); Takashige Fujimori, Tokyo (JP); Kenta Masuda, Tokyo (JP); Keiichi Akamatsu, Tokyo (JP)

(73) Assignee: JOLED, INC., Chiyoda-ku (JP)

( * ) Notice: Subject to any disclaimer, the term of this patent is extended or adjusted under 35 U.S.C. 154(b) by 0 days.

(21) Appl. No.: 15/207,047

(22) Filed: Jul. 11, 2016

(65) Prior Publication Data

US 2017/0062541 A1    Mar. 2, 2017

(30) Foreign Application Priority Data

Aug. 31, 2015 (JP) .................................. 2015-170699
Feb. 25, 2016 (JP) .................................. 2016-033836

(51) Int. Cl.
*H01L 27/32* (2006.01)
*H01L 51/00* (2006.01)

(52) U.S. Cl.
CPC ...... *H01L 27/3272* (2013.01); *H01L 27/3262* (2013.01); *H01L 27/3276* (2013.01); *H01L 51/0097* (2013.01); *H01L 2227/323* (2013.01); *H01L 2251/5338* (2013.01)

(58) Field of Classification Search
CPC . H01L 27/32; H01L 27/3272; H01L 27/3262; H01L 27/3276
See application file for complete search history.

(56) References Cited

U.S. PATENT DOCUMENTS

| | | | |
|---|---|---|---|
| 2007/0090345 A1* | 4/2007 | Wu | H01L 27/124 257/40 |
| 2010/0065952 A1 | 3/2010 | Oikawa et al. | |
| 2010/0301338 A1* | 12/2010 | Abe | H01L 21/6835 257/57 |
| 2015/0206931 A1* | 7/2015 | Choi | H01L 27/3272 257/72 |
| 2015/0277635 A1* | 10/2015 | Kim | G06F 3/047 345/173 |
| 2016/0056140 A1 | 2/2016 | Oikawa et al. | |

FOREIGN PATENT DOCUMENTS

| | | |
|---|---|---|
| JP | 2013-235598 | 11/2013 |
| JP | 2014-103410 | 6/2014 |

* cited by examiner

Primary Examiner — Phuc Dang
(74) Attorney, Agent, or Firm — Oblon, McClelland, Maier & Neustadt, L.L.P.

(57) ABSTRACT

There is provided a semiconductor device that includes a substrate, an electric field shielding layer, and a semiconductor element. The electric field shielding layer is provided on the substrate. The semiconductor element includes an electrode, and is provided on the electric field shielding layer with an insulating film in between.

15 Claims, 19 Drawing Sheets

US 9,935,165 B2

1

SEMICONDUCTOR DEVICE, DISPLAY UNIT, METHOD OF MANUFACTURING DISPLAY UNIT, AND ELECTRONIC APPARATUS

CROSS REFERENCE TO RELATED APPLICATIONS

The present application claims priority from Japanese Patent Application No. 2016-033836 filed on Feb. 25, 2016, the entire contents of which are hereby incorporated by reference.

BACKGROUND

The disclosure relates to a semiconductor device that includes a semiconductor element on a substrate, to a display unit that includes the semiconductor device, to a method of manufacturing the display unit, and to an electronic apparatus.

Recently, a semiconductor element such as a thin film transistor (TFT) is utilized in an electronic apparatus in various fields (for example, see Japanese Unexamined Patent Application Publication (JP-A) Nos. 2013-235598 and 2014-103410). JP-A Nos. 2013-235598 and 2014-103410 disclose a semiconductor device that performs wireless communication and in which an electrode is provided below a circuit including an antenna and a circuit including a thin film transistor.

SUMMARY

A semiconductor device that includes, on a substrate, a semiconductor element such as a thin film transistor involves generation of an electric field between the semiconductor element and the substrate, thereby resulting in deterioration of characteristics such as a bias stress effect. It is therefore desirable that variation in the characteristics of the semiconductor element be suppressed in the semiconductor device.

It is desirable to provide a semiconductor device, a display unit, a method of manufacturing a display unit, and an electronic apparatus that each make it possible to suppress variation in characteristics of a semiconductor element that is provided on a substrate.

A semiconductor device according to an illustrative embodiment of the disclosure includes: a substrate; an electric field shielding layer provided on the substrate; and a semiconductor element including an electrode, and provided on the electric field shielding layer with an insulating film in between.

A display unit according to an illustrative embodiment of the disclosure includes: a substrate; an electric field shielding layer provided on the substrate; a semiconductor element including an electrode, and provided on the electric field shielding layer with an insulating film in between; and a display element layer including a plurality of pixels, and provided on the semiconductor element.

A method of manufacturing a display unit according to an illustrative embodiment of the disclosure includes: forming an electric field shielding layer on a substrate; forming a semiconductor element on the electric field shielding layer with an insulating film in between, the semiconductor element including an electrode; and forming a display element layer on the semiconductor element, the display element layer including a plurality of pixels.

An electronic apparatus according to an illustrative embodiment of the disclosure includes a display unit. The

2 display unit includes: a substrate; an electric field shielding layer provided on the substrate; a semiconductor element including an electrode, and provided on the electric field shielding layer with an insulating film in between; and a display element layer including a plurality of pixels, and provided on the semiconductor element.

In the semiconductor device, the display unit, the method of manufacturing the display unit, and the electronic apparatus according to the respective illustrative embodiments of the disclosure, the electric field shielding layer is provided on the substrate, and the semiconductor element is provided on the electric field shielding layer with the insulating film in between. In other words, the electric field shielding layer is provided between the substrate and the semiconductor element. When the electrode of the semiconductor element receives a voltage, an electric field may be generated between the semiconductor element and the substrate; however, the provision of the electric field shielding layer between the semiconductor element and the substrate suppresses arrival of the electric field at the substrate.

According to the semiconductor device, the display unit, the method of manufacturing the display unit, and the electronic apparatus of the respective illustrative embodiments of the disclosure, the provision of the electric field shielding layer on the substrate and the provision of the semiconductor element on the electric field shielding layer with the insulating film in between suppress arrival of the electric field at the substrate from the semiconductor element. As a result, it is possible to suppress the variation in the characteristics of the semiconductor element.

It is to be understood that both the foregoing general description and the following detailed description are exemplary, and are intended to provide further explanation of the disclosure as claimed. Effects of the disclosure are not limited to those described above. The disclosure may have effects different from those described above, or may further have other effects in addition to those described above.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Some example embodiments of the disclosure will be described below in detail, in the following order, with reference to the accompanying drawings.

Figure 1:
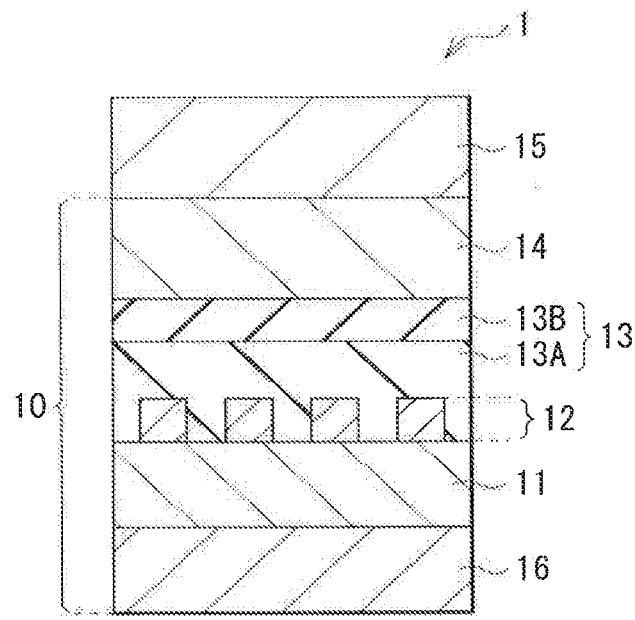
FIG. 1 is a schematic cross-sectional view illustrating an example of an outline configuration of a display unit according to a first example embodiment of the disclosure.

1. First Example Embodiment (An example of a semiconductor device and a display unit that each may include a thin film transistor provided on a substrate with an electric field shielding layer in between)
2. Second Example Embodiment (An example in which an electric field shielding layer may be grounded via an electrically-conductive layer embedded in a substrate)
3. Examples of Functional Configuration of Display Unit
4. Examples of Image Pickup Unit
5. Examples of Electronic Apparatus First Example Embodiment Configuration FIG. 1 schematically illustrates an example of a cross-sectional configuration of a display unit (a display unit 1) according to a first example embodiment of the disclosure. The display unit 1 may be, for example, an organic electroluminescent (EL) unit. The display unit 1 includes a semiconductor device 10 and a display element layer 15 that is provided on the semiconductor device 10. The semiconductor device 10 includes a substrate 11, and may also include, for example, an electric field shielding layer 12, an insulating film 13, and a TFT layer 14 that are provided in order on the substrate 11. A metal thin film 16 may be provided on a back surface of the substrate 11 (a surface, of the substrate 11, opposite to a surface thereof provided with the electric field shielding layer 12).

The substrate 11 may be a flexible substrate (a substrate having flexibility), for example. The substrate 11 may be made of a resin material such as polyethylene terephthalate (PET), polyimide (PI), polycarbonate (PC), and polyethylene naphthalate (PEN), for example. The substrate 11 may be made of a material such as polyamide, spin-on-glass (SOG), and polyether sulfone (PES), besides the foregoing materials. The material that configures the substrate 11 is not limited to the resin materials. The substrate 11 may be a metal film coated with an insulating material, for example.

Non-limiting examples of the metal film may include a film of stainless steel (SUS). Alternatively, the substrate 11 may be made of a rigid material such as glass, for example.

The electric field shielding layer 12 may be provided, for example, in a selected region on the substrate 11, and may have a fixed potential (the electric field shielding layer 12 may receive the fixed potential). A specific configuration of the electric field shielding layer 12 will be described later.

The insulating film 13 may include an organic insulating film 13A and an inorganic insulating film 13B in order from the electric field shielding layer 12 side, for example.

The organic insulating film 13A may be so provided as to cover the electric field shielding layer 12, and may serve, for example, to planarize a surface of the substrate 11 on which the electric field shielding layer 12 is provided. The organic insulating film 13A may contain an organic material such as polyimide and a siloxane-based compound, for example. The organic insulating film 13A may have a thickness from about 4 μm to about 20 μm both inclusive, for example.

The inorganic insulating film 13B may be so provided as to be in contact with a bottom surface of a semiconductor layer 141 (which will be described later) in the TFT layer 14. The inorganic insulating film 13B may serve to provide a favorable interface with respect to the semiconductor layer 141, for example. The inorganic insulating film 13B may be one of a single-layer film and a multi-layered film that each contain one or more of materials such as silicon oxide ($SiO_x$), silicon nitride (SiN), silicon oxynitride (SiON), and phosphorus (P)-doped SiO, for example. Alternatively, the inorganic insulating film 13B may contain aluminum oxide ($Al_2O_3$), for example. The inorganic insulating film 13B may have a thickness from about 200 nm to about 1000 nm both inclusive, for example.

It is to be noted that, although the insulating film 13 may be a multi-layered film including the organic insulating film 13A and the inorganic insulating film 13B in the present example embodiment, the insulating film 13 may be only one of the organic insulating film and the inorganic insulating film. However, it is preferable that a multi-layered film, such as the insulating film 13 in the present example embodiment, including the organic insulating film 13A and the inorganic insulating film 13B be used. One reason for this is because the lamination of the organic insulating film 13A and the inorganic insulating film 13B increases a distance between the semiconductor layer 141 and the electric field shielding layer 12, which suppresses a so-called back channel effect. The back channel effect refers to the following phenomenon. A ground potential of the electric field shielding layer 12 causes an unintended decrease in a potential of the semiconductor layer 141, which prevents carrier induction by a gate electrode 143 which will be described later, thereby increasing a threshold voltage as a result. More specifically, as with a well-known TFT having a dual-gate structure, the electric field shielding layer 12 may serve as a "second" gate electrode that controls the amount of flowing carriers from the back channel side. This may provide a state that is equivalent to a state in which 0 (zero) V is applied to the electric field shielding layer 12. This results in an increase in a voltage that is supposed to be applied to the gate electrode 143 to provide a desirable drain current, which, in turn, increases electric power consumption in the device as a whole. When only the inorganic insulating film 13B is provided, it may be difficult to provide sufficient distance between the semiconductor layer 141 and the electric field shielding layer 12, which may cause a concern over an influence of the back channel effect described above. As in the present example embodiment, the lamination of the organic insulating film 13A and the inorganic insulating film 13B provides the sufficient distance between the semiconductor layer 141 and the electric field shielding layer 12. Accordingly, it is possible to suppress the influence of the back channel effect while providing the effect achieved by the electric field shielding layer 12.

The TFT layer 14 may include a thin film transistor (a TFT 10a). The TFT 10a may be a top-gate thin film transistor, for example. The TFT 10a may include, for example, the semiconductor layer 141 in a selected region on the insulating film 13. The gate electrode 143 may be provided on the semiconductor layer 141 with a gate insulating film 142 in between. A protective film 144 and an inter-layer insulating film 146A may be so provided as to cover the semiconductor layer 141, the gate insulating film 142, and the gate electrode 143. The protective film 144 and the inter-layer insulating film 146A may have a contact hole H1 in a region that is opposed to part of the semiconductor layer 141. A source-drain electrode 145 may be so provided on the inter-layer insulating film 146A that the contact hole H1 is filled with the source-drain electrode 145. An inter-layer insulating film 146B may be so provided as to cover the inter-layer insulating film 146A and the source-drain electrode 145. It is to be noted that the TFT 10a may correspond to a "semiconductor element" in one specific but non-limiting embodiment of the disclosure, and the gate electrode 143 and the source-drain electrode 145 may each correspond to an "electrode" in one specific but non-limiting embodiment of the disclosure.

The semiconductor layer 141 may be provided on the insulating film 13 to have a pattern. The semiconductor layer 141 may include a channel region (an active region) in a region that is opposed to the gate electrode 143. The semiconductor layer 141 may be made of an oxide semiconductor that contains, as a major component, oxide of one or more of elements such as indium (In), gallium (Ga), zinc (Zn), tin (Sn), titanium (Ti), and niobium (Nb), for example. Specific but non-limiting examples of such an oxide semiconductor may include indium-tin-zinc oxide (ITZO), indium-gallium-zinc oxide (IGZO: InGaZnO), zinc oxide (ZnO), indium-zinc oxide (IZO), indium-gallium oxide (IGO), indium-tin oxide (ITO), and indium oxide (InO). Alternatively, the semiconductor layer 141 may be made of a material such as low-temperature polysilicon (LTPS) and amorphous silicon (a-Si), for example.

The gate insulating film 142 may be a single-layer film that is made of one of materials such as silicon oxide ($SiO_x$), silicon nitride ($SiN_x$), silicon oxynitride (SiON), and aluminum oxide ($AlO_x$), for example. Alternatively, the gate insulating film 142 may be a multi-layered film that includes two or more of the foregoing materials, for example.

The gate electrode 143 may control carrier density in the semiconductor layer 141, based on a gate voltage (Vg) that is applied to the gate electrode 143. Also, the gate electrode 143 may serve as a wiring pattern that supplies a potential. The gate electrode 143 may be made of a simple substance that contains one of materials such as titanium (Ti), tungsten (W), tantalum (Ta), aluminum (Al), molybdenum (Mo), silver (Ag), neodymium (Nd), and copper (Cu), for example. Alternatively, the gate electrode 143 may be made of an alloy that includes one of the foregoing materials, for example. Alternatively, the gate electrode 143 may be made of a compound that includes one or more of the foregoing materials, or of a multi-layered film that includes two or more of the foregoing materials, for example. Alternatively, the gate electrode 143 may include a transparent electrically-conductive film such as a film of ITO, for example.

The protective film 144 may be made of a material such as titanium oxide, aluminum oxide, indium oxide, and tin oxide, for example. The protective film 144 may serve as a barrier film against moisture.

The inter-layer insulating films 146A and 146B may be made of an organic material such as acrylic resin, polyimide (PI), and novolac resin, for example. Alternatively, the inter-layer insulating film 146A may include an inorganic material such as a silicon oxide film, a silicon nitride film, a silicon oxynitride film, and aluminum oxide, for example.

The source-drain electrode 145 may serve as one of a source and a drain of the TFT 10a. The source-drain electrode 145 may include one or more of metal and the transparent conductive film that have been mentioned above as the material for the gate electrode 143. It is preferable that a material having favorable electric conductivity be selected for the source-drain electrode 145.

The display element layer 15 may include a plurality of pixels. The display element layer 15 may also include a display element (a light emitting element) that may be driven, to perform display, by a backplane with a plurality of TFTs 10a arranged thereon. Non-limiting examples of the display element may include an organic EL element. The organic EL element may include an anode electrode, an organic electroluminescent layer, and a cathode electrode in order from the TFT layer 14 side, for example. The anode electrode, the organic electroluminescent layer, and the cathode electrode may correspond to a "first electrode", a "display function layer", and a "second electrode" in one specific but non-limiting embodiment of the disclosure, respectively. The anode electrode may be coupled to the source-drain electrode 145 of the TFT 10a. The cathode electrode may receive a cathode potential, for example, via a wiring pattern WL2 which will be described later. The cathode potential may be common to the respective pixels.

For example, in a case where the substrate 11 is a flexible substrate (a substrate configured of an organic material), or in any other case, the metal thin film 16 may be attached onto the back surface of the substrate 11 for protection of the substrate 11, reinforcement thereof, or any other purpose. The metal thin film 16 may not be provided when the substrate 11 includes a metal film, or is made of a material such as glass.

(Detailed Configuration of the Electric Field Shielding Layer 12)

Figure 3:
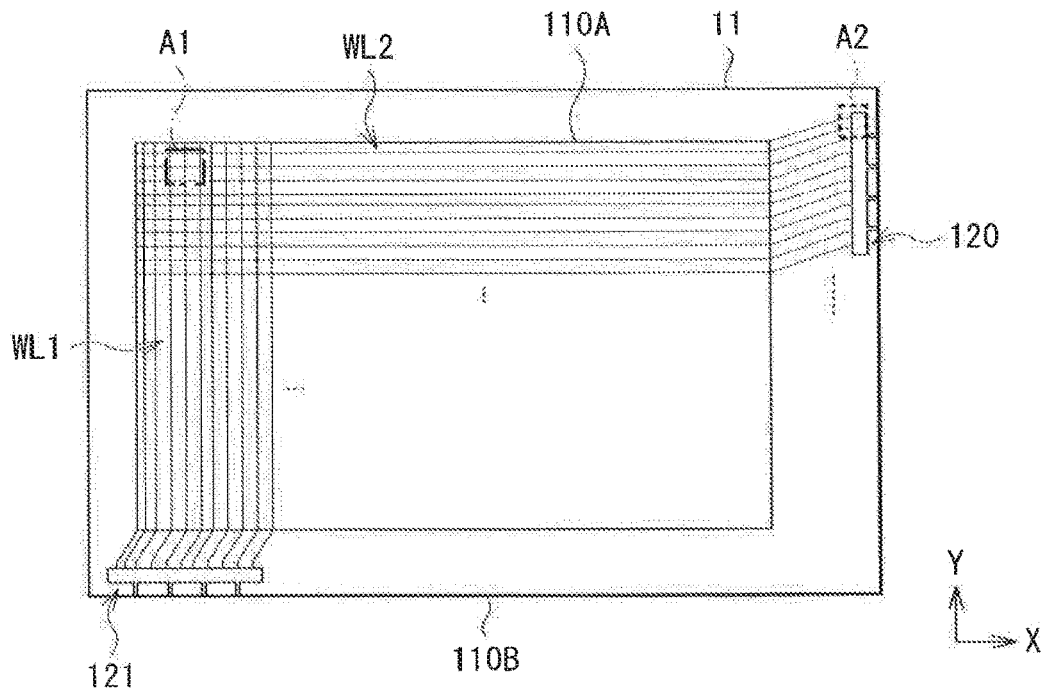
FIG. 3 is a schematic plan view for describing an example of a wiring pattern configuration of the display unit illustrated in FIG. 1.
Figure 4:
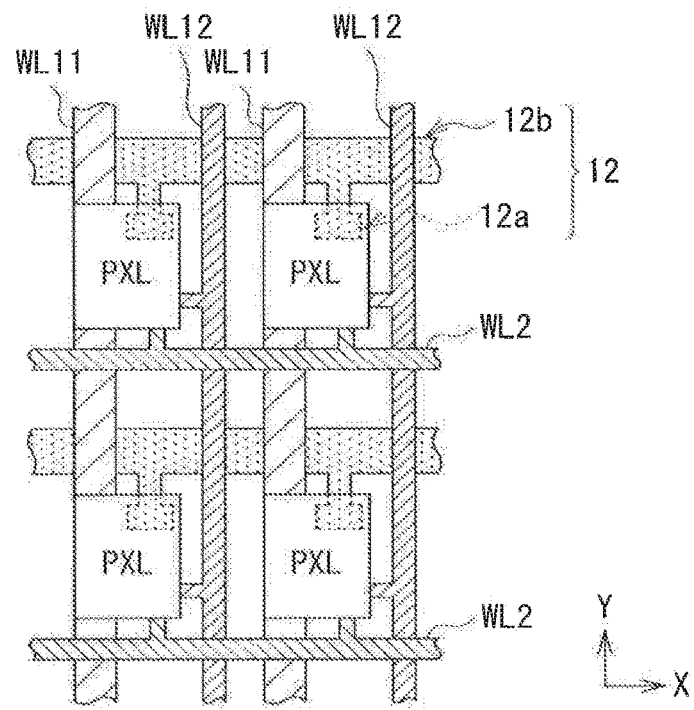
FIG. 4 is a plan view illustrating an example of a configuration of a part corresponding to a region A1 illustrated in FIG. 3, together with an example of a configuration of an electric field shielding layer.
Figure 5A:
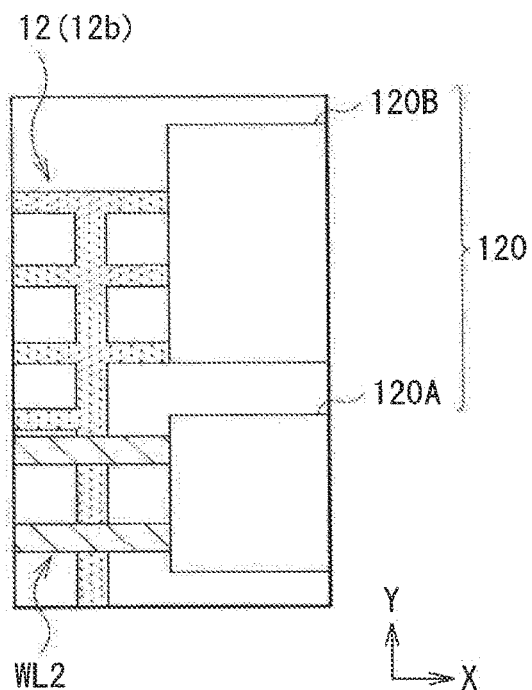
FIG. 5A is a plan view illustrating an example of a configuration of a part corresponding to a region A2 illustrated in FIG. 3, together with the example of the configuration of the electric field shielding layer.
Figure 5B:
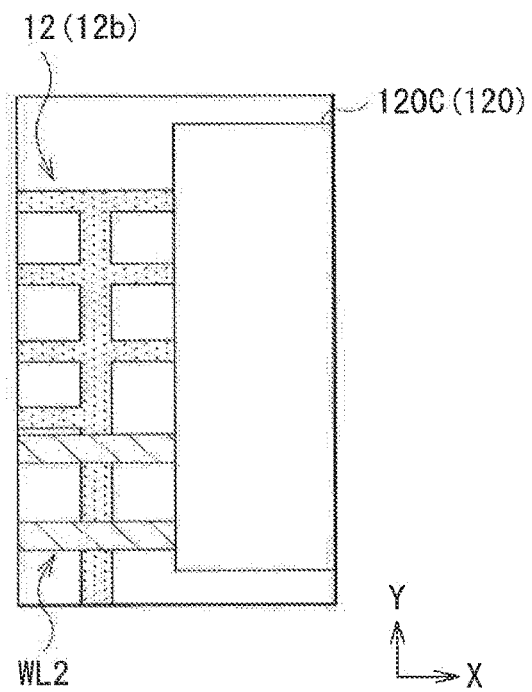
FIG. 5B is a plan view illustrating another example of the configuration of the part corresponding to the region A2 illustrated in FIG. 3, together with the example of the configuration of the electric field shielding layer.

FIG. 3 is a schematic plan view for describing a wiring pattern configuration (a backplane configuration) of the display unit 1. FIG. 4 is a plan view that illustrates a configuration of a part corresponding to a region A1 illustrated in FIG. 3, together with the configuration of the electric field shielding layer 12. FIGS. 5A and 5B are each a plan view that illustrates a configuration of a part corresponding to a region A2 illustrated in FIG. 3, together with the configuration of the electric field shielding layer 12.

Wiring patterns WL1 and wiring patterns WL2 may be arranged in a Y-direction and an X-direction, respectively, in a display region 110A on the substrate 11. Terminal sections 120 and 121 may be provided in a surrounding region 110B around the display region 110A. The terminal sections 120 and 121 may serve to supply potentials to the wiring patterns WL2 and WL1, respectively. The electric field shielding layer 12 may be preferably provided in a selected region depending on the arrangement configuration of the wiring patterns WL1 and WL2 and pixels PXL (the TFTs 10a). However, the electric field shielding layer 12 may be provided over the entire surface of the substrate 11 in a continuous form.

The wiring patterns WL1 and WL2 may each serve as one of lines such as a signal line, a scanning line, a power line, and a common potential line, for example. A point in which one of the wiring patterns WL1 intersects corresponding one of the wiring patterns WL2 may correspond to one of the pixels PXL. The wiring patterns WL1 and WL2 may extend from the display region 110A to the surrounding region 110B, and may be coupled to the terminal sections 121 and 120 in the surrounding region 110B, respectively. The wiring patterns WL2 may include, for example, the common potential line (a cathode line), and may be coupled to the terminal section 120 in the surrounding region 110B. The wiring patterns WL1 may include, for example, wiring patterns WL11 and wiring patterns WL12. It is to be noted that FIG. 4 schematically illustrates a configuration of a circuit and wiring patterns in the backplane, in which the wiring patterns WL11 may serve as power lines, the wiring patterns WL12 may serve as signal lines, and the wiring patterns WL2 may serve as the common potential line (the cathode line), for example.

The terminal sections 120 and 121 may supply potentials to the wiring patterns WL2 and WL1, respectively, and may be coupled to an unillustrated power supply. The terminal section 120 may include, for example, a terminal section that supplies a fixed potential such as a cathode potential (one of terminal sections 120A and 120C that are illustrated in FIGS. 5A and 5B, respectively). It is to be noted that, although the terminal sections 120 and 121 are illustrated to be provided on two sides of the rectangular substrate 11 as an example, the terminal sections 120 and 121 may be provided on only one side of the substrate 11, or may be provided on three or four sides of the substrate 11, alternatively.

It is to be noted that, although the TFTs 10a are not illustrated in FIGS. 3 and 4, it is assumed that the TFTs 10a are arranged in the pixels PXL one by one in the present example embodiment. The number of the TFTs 10a arranged in each of the pixels PXL is, however, not limited and two or more TFTs 10a may be provided in each of the pixels PXL, for example.

The electric field shielding layer 12 may include an island part 12a and a wiring pattern part 12b as illustrated in FIG. 4, for example. The wiring pattern part 12b may be electrically coupled to the island part 12a. The island part 12a may be provided for each of the pixels PXL, for example. The island part 12a may have, for example, a shape in which the island part 12a overlaps the semiconductor layer 141 of the TFT 10a in a plan view. The wiring pattern part 12b may be provided for each pixel column, and may extend in the X-direction (in a direction parallel to the wiring patterns WL2), for example. The island parts 12a provided for one column of the pixels PXL may be coupled to corresponding one of the wiring pattern parts 12b.

The electric field shielding layer 12 may include an electrically-conductive film, and may preferably include a transparent electrically-conductive film, for example. The transparent electrically-conductive film may be made of an oxide semiconductor that contains, as a major component, oxide of one or more of elements such as indium, gallium, zinc, tin, titanium, and niobium, for example. Further, the transparent electrically-conductive film may be preferably made of, for example, a material that is less likely to absorb light having a wavelength from about 600 nm to about 1100 nm both inclusive, or of degenerate semiconductor. Non-limiting examples of such materials may include ITO, IZO, and amorphous silicon in which an n-type impurity is dispersed at high concentration ($n^+$-type a-Si). The electric field shielding layer 12 may be a single-layer film that contains the foregoing materials. Alternatively, the electric field shielding layer 12 may be a multi-layered film that contains the foregoing materials. The use of such a transparent electrically-conductive film makes it possible to suppress damage caused by a laser beam on metal wiring patterns that are provided on layers on or above the electric field shielding layer 12, when a defective point in the metal wiring patterns is to be repaired (when laser repair is to be performed on the metal wiring patterns). The foregoing layers on or above the electric field shielding layer 12 may refer to, for example, the TFT layer 14, the display element layer 15, or any other layer provided on or above the electric field shielding layer 12. However, the electric field shielding layer 12 is not limited to the foregoing transparent electrically-conductive film, and may be made of metal such as molybdenum (Mo), tungsten (W), and aluminum (Al).

The electric field shielding layer 12 may have a thickness from about 10 nm to about 300 nm both inclusive, for example. More specifically, the electric field shielding layer 12 may have a thickness of about 20 nm, for example. The electric field shielding layer 12 may have a sheet resistance from about 1 $\Omega/cm^2$ to about 1 $M\Omega/cm^2$ both inclusive, for example. The electric field shielding layer 12 may preferably have a sheet resistance of about 1 $\Omega/cm^2$ or greater (about 1 $M\Omega/cm^2$, for example) especially when the insulating film 13 includes the organic insulating film 13A as in the present example embodiment. One reason for this is because providing the electric field shielding layer 12 with the sheet resistance of about 1 $k\Omega/cm^2$ or greater suppresses burning damage caused by a leakage current, which will be described in more detail later. It is to be noted that, when the insulating film 13 includes only the inorganic insulating film 13B (when the insulating film 13 does not include the organic insulating film 13A), the electric field shielding layer 12 may preferably have a lower sheet resistance, in contrast to the foregoing case where the insulating film 13 includes the organic insulating film 13A. The electric field shielding layer 12 may be provided over the entire surface of the substrate 11. However, it is preferable that the electric field shielding layer 12 be provided in a selected region as in the present example embodiment. One reason for this is because the provision of the electric field shielding layer 12 in the selected region reduces a parasitic capacitance, and thereby suppresses occurrence of the leakage current.

The electric field shielding layer 12 may have a fixed potential (the electric field shielding layer 12 may receive the fixed potential). More specifically, the electric field shielding layer 12 may have a ground (GND) potential (0 (zero) V, for example). In this case, the electric field shielding layer 12 may be electrically coupled, in the surrounding region 110B (at an end of the substrate 11), to a terminal section that may serve to supply the fixed potential. FIG. 5A illustrates an example in which the terminal section 120A and a terminal section 120B may be provided separately in the surrounding region 110B, and the electric field shielding layer 12 may be electrically coupled to the terminal section 120B (more specifically, the wiring pattern part 12b). The terminal section 120A may serve to supply the cathode potential (a ground potential, for example) common to the respective pixels PXL. The terminal section 120B may serve to supply the fixed potential. The fixed potential may correspond to a "second fixed potential" in one specific but non-limiting embodiment of the disclosure. FIG. 5B illustrates an alternative example in which the electric field shielding layer 12 (more specifically, the wiring pattern part 12b) may be electrically coupled, together with the wiring pattern WL2, to the terminal section 120C that serves to supply the cathode potential. It is to be noted that the terminal section 120C and the terminal section 120B may correspond to a "first terminal section" and a "second terminal section" in one specific but non-limiting embodiment of the disclosure, respectively.

Manufacturing Method

The foregoing display unit 1 may be manufactured as follows, for example. FIGS. 6A to 10 illustrate an example of a process of manufacturing the display unit 1 in order.

Figure 6A:
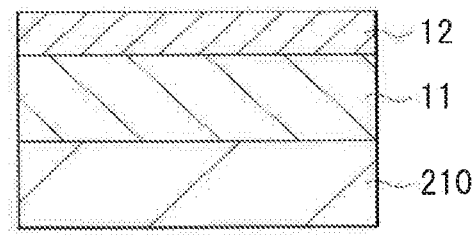
FIG. 6A is a schematic cross-sectional view illustrating an example of a process in a method of manufacturing the display unit illustrated in FIG. 1.

First, referring to FIG. 6A, a support base 210 made of a material such as glass may be attached onto the back surface of the substrate 11 that may be a flexible substrate, for example. Thereafter, the electric field shielding layer 12 made of the foregoing material (such as the transparent electrically-conductive film material) may be formed on the substrate 11. The electric field shielding layer 12 may be formed by sputtering to have a thickness of about 20 nm, for example.

Figure 6B:
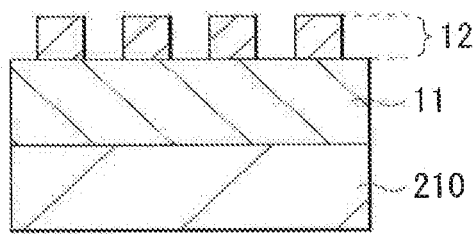
FIG. 6B is a schematic cross-sectional view illustrating an example of a process after the process illustrated in FIG. 6A.

Referring to FIG. 6B, the electric field shielding layer 12 may be patterned thereafter. More specifically, the electric field shielding layer 12 may be processed into a shape that includes the island part 12a and the wiring pattern part 12b as illustrated in FIG. 4. The processing of the electric field shielding layer 12 may be performed by a method such as photolithography and wet etching.

Figure 6C:
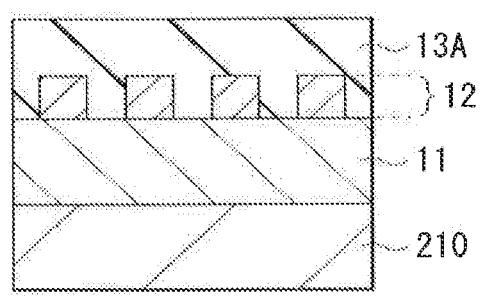
FIG. 6C is a schematic cross-sectional view illustrating an example of a process after the process illustrated in FIG. 6B.

Referring to FIG. 6C, the organic insulating film 13A made of the foregoing material and having the foregoing thickness may be formed on the electric field shielding layer 12 thereafter. The forming of the electric organic insulating film 13A may be performed through applying the foregoing material onto the electric field shielding layer 12 by a method such as spin coating, followed by performing burning at a predetermined temperature, for example.

Figure 6D:
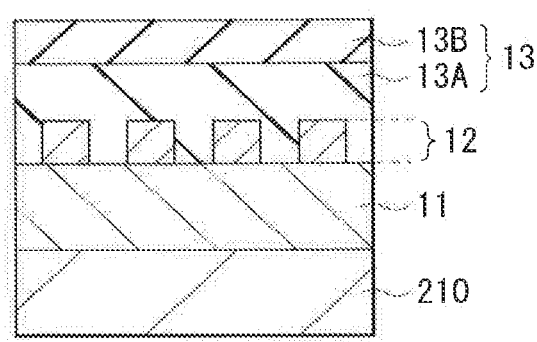
FIG. 6D is a schematic cross-sectional view illustrating an example of a process after the process illustrated in FIG. 6C.

Referring to FIG. 6D, the inorganic insulating film 13B made of the foregoing material and having the foregoing thickness may be formed on the organic insulating film 13A thereafter. The forming of the inorganic insulating film 13B may be performed by a method such as chemical vapor deposition (CVD).

Figure 2:
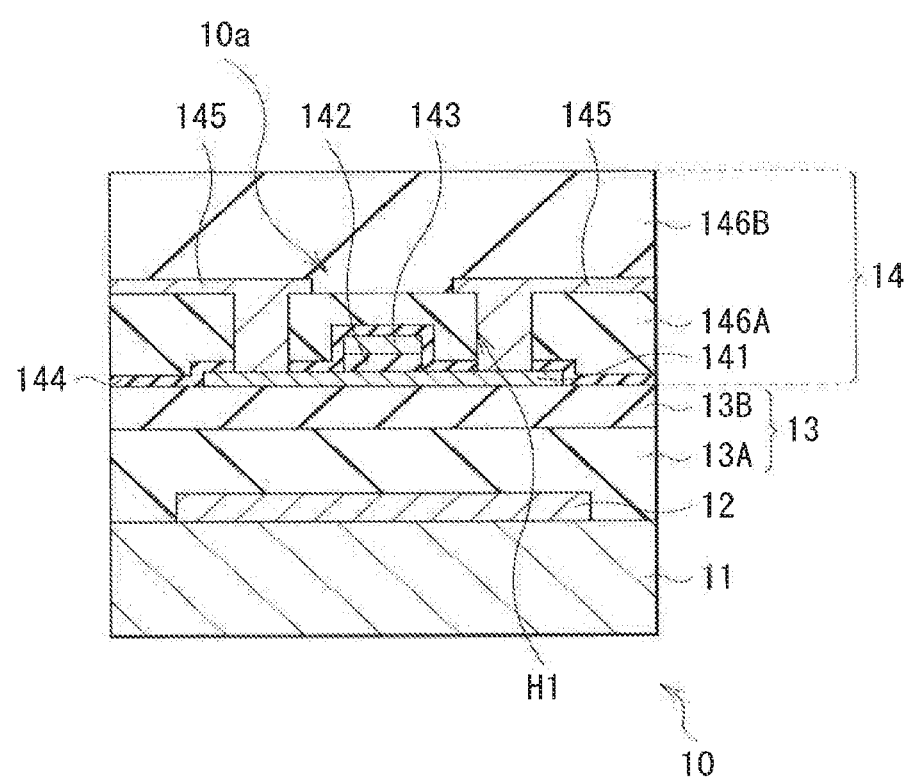
FIG. 2 is a cross-sectional view illustrating an example of a configuration of a semiconductor device illustrated in FIG. 1.
Figure 6E:
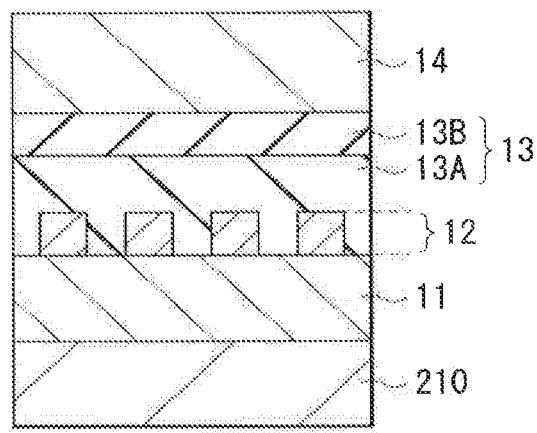
FIG. 6E is a schematic cross-sectional view illustrating an example of a process after the process illustrated in FIG. 6D.

Referring to FIG. 6E, the TFT layer 14 may be formed thereafter. The TFT 10a illustrated in FIG. 2 may be formed as an example of forming the TFT layer 14. More specifically, first, the semiconductor layer 141 made of the foregoing material (such as an oxide semiconductor) may be formed on the insulating film 13 by a method such as sputtering. Thereafter, the thus-formed semiconductor layer 141 may be patterned into a predetermined shape, for example, by photolithography and etching. It is preferable that a plan shape of the semiconductor layer 141 be almost the same as the plan shape of part (the island part 12a) of the electric field shielding layer 12. Thereafter, the gate insulating film 142 made of the foregoing material may be formed by a method such as CVD. Thereafter, the gate electrode 143 made of the foregoing material may be formed, in a pattern, on the gate insulating film 142, following which the gate insulating film 142 may be patterned through etching of the gate insulating film 142 with use of the patterned gate electrode 143 as a mask. Thereafter, the protective film 144 and the inter-layer insulating film 146A may be formed, following which the contact hole H1 may be provided, through the protective film 144 and the inter-layer insulating film 146A, in the region that is opposed to part of the semiconductor layer 141. Thereafter, the source-drain electrode 145 made of the foregoing metal material may be so formed on the inter-layer insulating film 146A that the contact hole H1 is filled with the source-drain electrode 145. This may complete the TFT 10a.

Figure 6F:
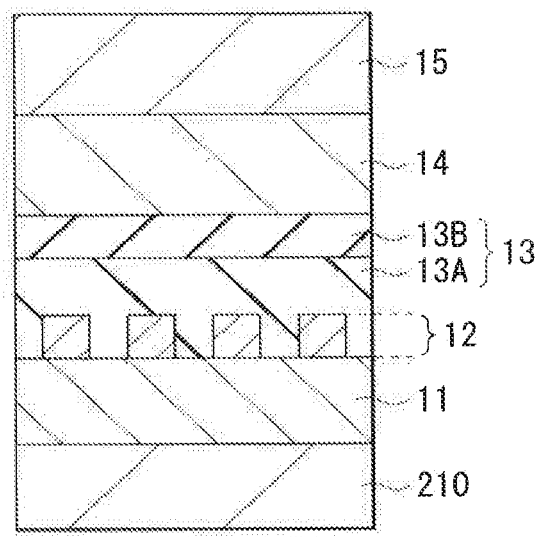
FIG. 6F is a schematic cross-sectional view illustrating an example of a process after the process illustrated in FIG. 6E.

Referring to FIG. 6F, the display element layer 15 may be formed on the TFT layer 14 thereafter. For example, when the display element layer 15 includes an organic EL element, the display element layer 15 that includes an anode electrode, an organic electroluminescent layer, and a cathode electrode may be formed on the TFT layer 14.

Figure 6G:
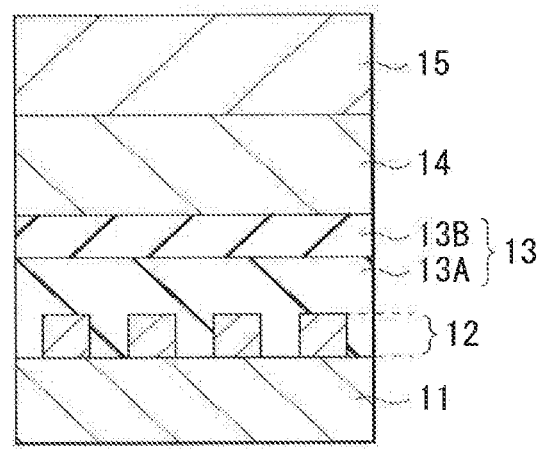
FIG. 6G is a schematic cross-sectional view illustrating an example of a process after the process illustrated in FIG. 6F.
Figure 7:
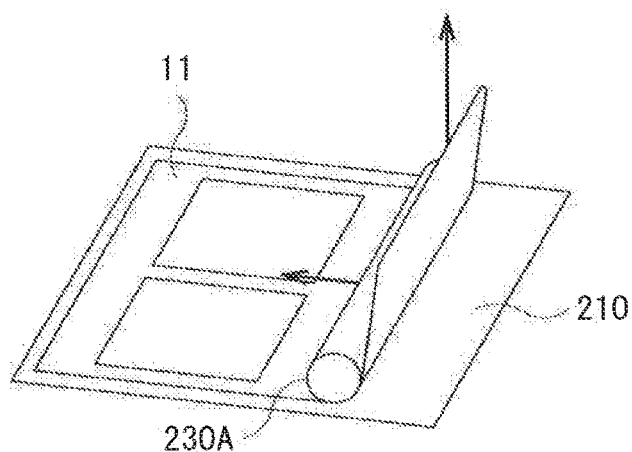
FIG. 7 is a schematic diagram for describing an example of a process of removing a supporting base.

Referring to FIG. 6G, the support base 210 may be removed thereafter. More specifically, a tool such as a roller 230A may be used to peel off the substrate 11 from the support base 210 as schematically illustrated in FIG. 7. It is to be noted that FIG. 7 illustrates a non-limiting example that includes a region corresponding to four panels.

Figure 8A:
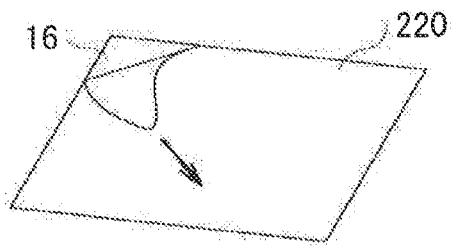
FIG. 8A is a schematic diagram illustrating an example of a process of preparing a metal thin film.
Figure 8B:
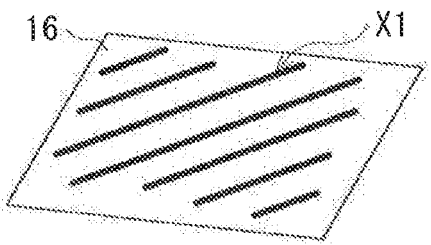
FIG. 8B is a schematic diagram illustrating an example of the metal thin film prepared in the process illustrated in FIG. 8A.

Referring to FIG. 8A, the metal thin film 16 may be prepared thereafter. In this phase, a protective film 220 may be attached onto the metal thin film 16 with an unillustrated adhesive layer in between; therefore, the protective film 220 may be removed from the metal thin film 16 before attaching the metal thin film 16 onto the substrate 11. As a result, the metal thin film 16 may be electrically charged, for example, in a direction (in an X1-direction) depending on the direction in which the metal thin film 16 has been removed, as schematically illustrated in FIG. 8B.

Figure 9:
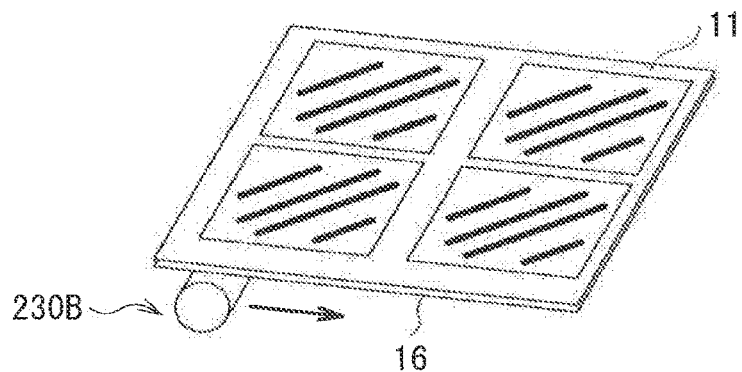
FIG. 9 is a schematic diagram for describing an example of a process of attaching the metal thin film to a back surface of a substrate.
Figure 10:
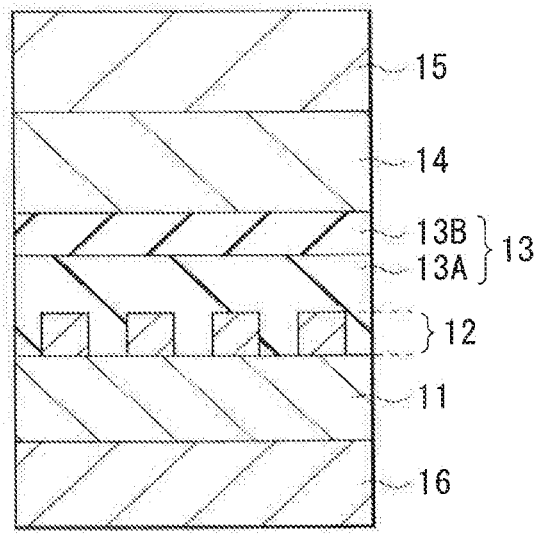
FIG. 10 is a schematic cross-sectional view illustrating an example of a process after the process illustrated in FIG. 9.

Referring to FIG. 9, the metal thin film 16 may be attached onto the back surface of the substrate 11 thereafter with applying pressure thereto, with the use of a tool such as a roller 230B. The metal thin film 16 may be thereby formed on the back surface of the substrate 11 as illustrated in FIG. 10. This may complete the display unit 1 illustrated in FIG. 1.

Actions and Effects

In the display unit 1 according to the present example embodiment, the respective pixels in the display element layer 15 may be driven, to perform display, based on an image signal that may be supplied from outside, thus performing image display. Upon performing display in such a manner, the TFT layer 14 of the semiconductor device 10 may involve driving of the respective TFTs 10a on a pixel-by-pixel basis in response to a supplied voltage, for example. More specifically, when a voltage that is equal to or greater than a threshold voltage is applied to the gate electrode 143 of the TFT 10a corresponding to one of the pixels, the semiconductor layer 141 may be activated (the semiconductor layer 141 may form a channel), which may cause a current to flow between the pair of source-drain electrodes 145.

Figure 11:
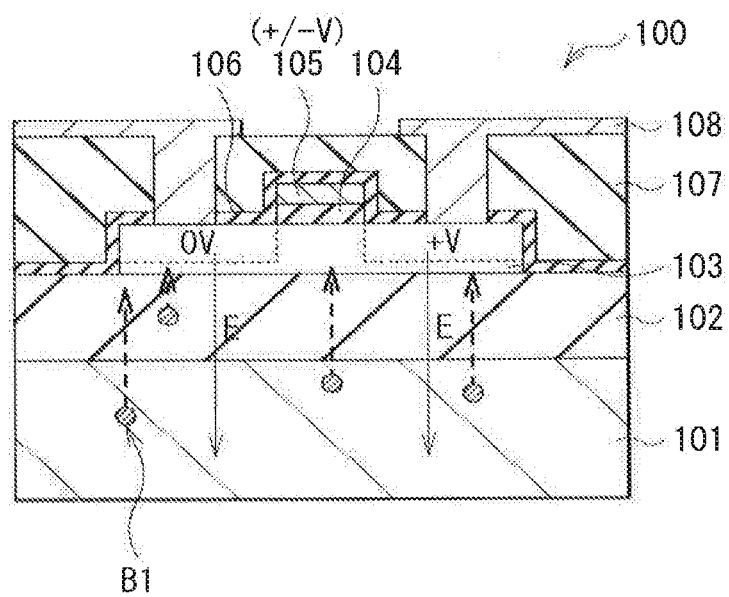
FIG. 11 is a schematic cross-sectional view illustrating a configuration of a semiconductor device according to Comparative example 1, and illustrating an action thereof.
Figure 12:
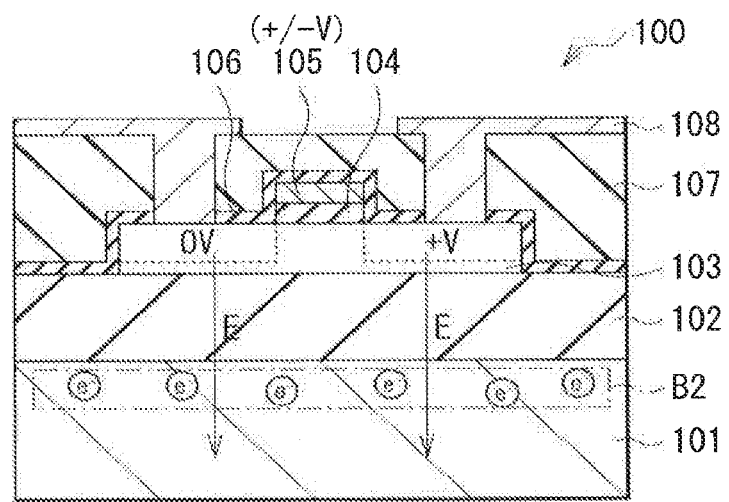
FIG. 12 is a schematic cross-sectional view illustrating the configuration of the semiconductor device according to Comparative example 1, and illustrating another action thereof.

FIGS. 11 and 12 each illustrate a structure of key part of a semiconductor device 100 according to Comparative example 1 of the present example embodiment. As with the semiconductor device 10 of the present example embodiment, the semiconductor device 100 includes a substrate 101, and a top-gate TFT provided on the substrate 101 with an insulating film 102 in between. The substrate 101 may be a flexible substrate, for example. More specifically, a semiconductor layer 103 is provided in a selected region on the insulating film 102. A gate insulating film 104 and a gate electrode 105 are provided in order on the semiconductor layer 103. A protective film 106 and an inter-layer insulating film 107 are so provided to cover the semiconductor layer 103, the gate insulating film 104, and the gate electrode 105. A source-drain electrode 108 is provided on the inter-layer insulating film 107. The source-drain electrode 108 is electrically coupled to the semiconductor layer 103.

In the semiconductor device 100 of Comparative example 1, when the gate electrode 105 receives a voltage (+V or −V) equal to or greater than a threshold voltage, a channel is formed in the semiconductor layer 103, which causes a current to flow between the source-drain electrodes 108. Upon flowing of the current, an electric field E is generated between the semiconductor layer 103 and the substrate 101 due to the application of the current to the gate electrode 105 and the source-drain electrodes 108. This electric field E leads to induction of a causative substance B1 induced inside the substrate 101 as illustrated in FIG. 11, or alternatively, leads to generation of an electric charge B2 on the surface of the substrate 101 as illustrated in FIG. 12. Such a causative substance B1 or electric charge B2 affects the semiconductor layer 103, resulting in variation in the threshold voltage of the TFT under the influence of a so-called bias stress effect.

Figure 13:
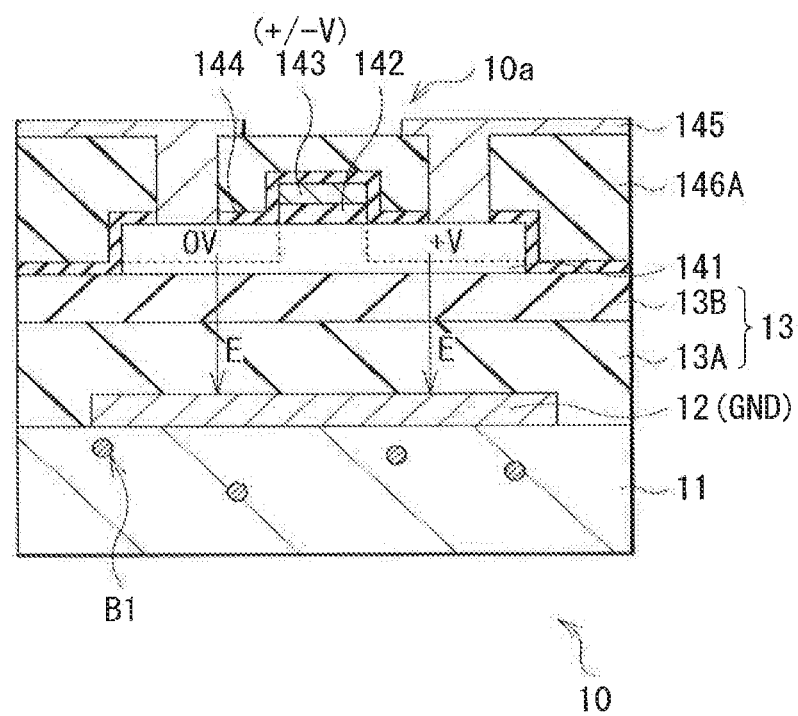
FIG. 13 is a schematic cross-sectional view for describing an example of an electric field shielding effect involved in the semiconductor device illustrated in FIG. 2.

In contrast, the semiconductor device 10 according to the present example embodiment has a structure in which the electric field shielding layer 12 is provided on the substrate 11, and the TFT 10a may be provided on the electric field shielding layer 12 with the insulating film 13 in between, as illustrated in FIG. 13. In other words, the electric field shielding layer 12 may be provided between the substrate 11 and the TFT 10a. This makes it possible to suppress arrival of the foregoing electric field E at the substrate 11 from the semiconductor layer 141 (the electric field shielding layer 12 shields the substrate 11 from the electric field E), when the gate electrode 143 receives a voltage (+V or −V) equal to or greater than the threshold voltage and a current is thereby caused to flow between the source-drain electrodes 145.

Figure 14A:
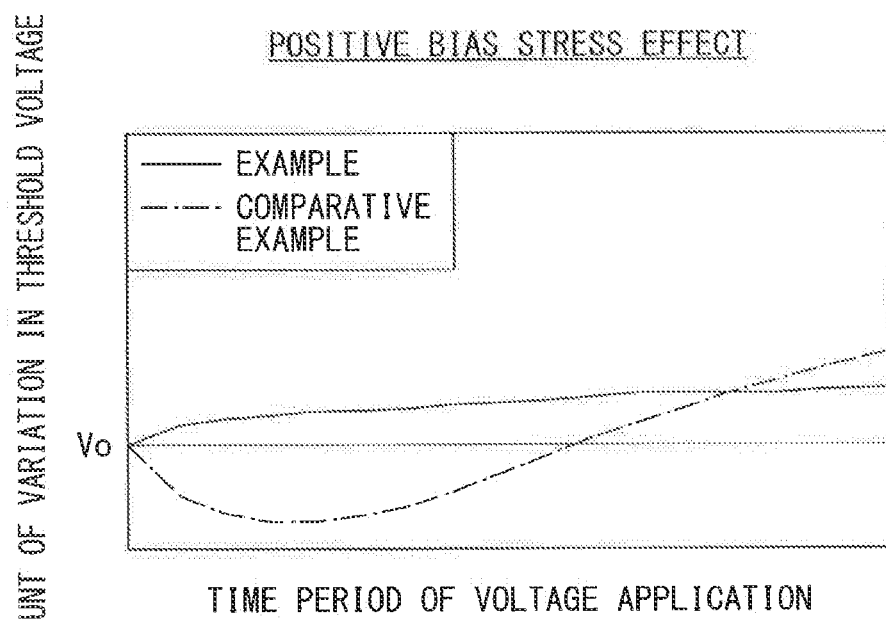
FIG. 14A is a characteristic diagram illustrating positive bias stress effects according to Example and Comparative example 1.
Figure 14B:
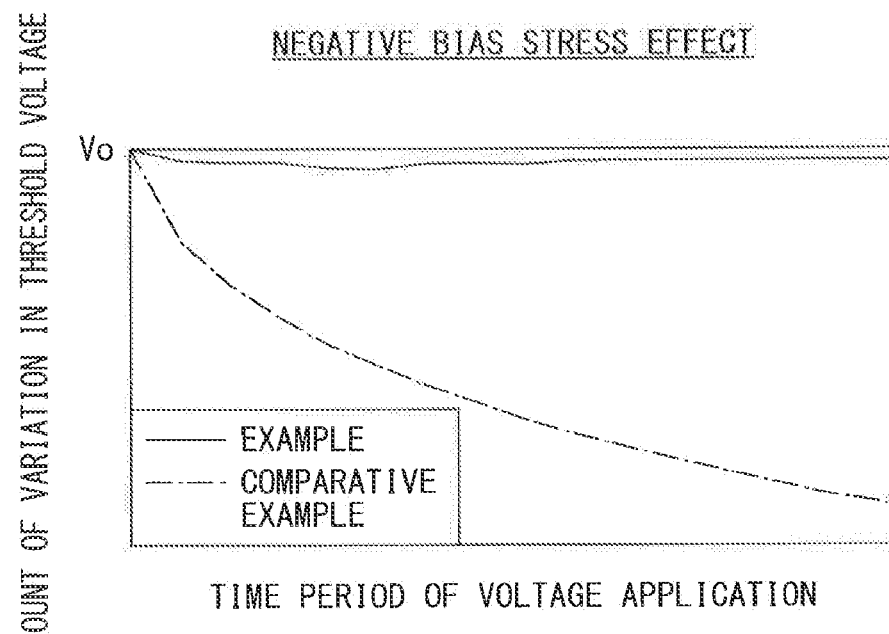
FIG. 14B is a characteristic diagram illustrating negative bias stress effects according to Example and Comparative example 1.

This improves (or stabilizes) the bias stress effect, suppressing variation in the threshold voltage. FIG. 14A illustrates an example of a positive bias stress effect according to Example (the semiconductor device 10 that includes the electric field shielding layer 12) and Comparative example 1 (the semiconductor device 100). Also, FIG. 14B illustrates an example of a negative bias stress effect according to Example and Comparative example 1. As can be seen from FIGS. 14A and 14B, the variation in a threshold voltage Vo, caused in both the positive bias stress effect and the negative bias stress effect, is smaller in Example than in Comparative example 1.

Also, the present example embodiment involves a structure in which the electric field shielding layer 12 may be provided in the selected region on the substrate 11. More specifically, the electric field shielding layer 12 may have a part (the island part 12a) that overlaps the semiconductor layer 141 in a plan view. This makes it possible to more effectively suppress variation in the characteristics of the TFT 10a such as those described above.

Also, the present embodiment achieves the following effect by providing the electric field shielding layer 12. In the foregoing manufacturing process, the removal of the support base 210 may involve unevenness in removal (FIGS. 6G and 7), which makes it easier to cause static electricity on the back surface of the substrate 11 (makes it easier for the back surface of the substrate 11 to be electrically charged). Also, the preparation of the metal thin film 16 (FIGS. 8A and 8B) may involve electrical charging of the metal thin film 16 in a predetermined direction as a result of the removal of the protective film 220. Even when such processes are performed, it is possible to shield the TFT 10a from the static electricity caused on the back surface of the substrate 11 by providing the electric field shielding layer 12 between the substrate 11 and the TFT 10a. This suppresses variation in the characteristics of the TFT 10a and improves reliability.

In addition thereto, the present example embodiment makes it possible to improve yields of the semiconductor device 10 and suppress degradation of reliability of the semiconductor device 10 by configuring the electric field shielding layer 12 by the transparent electrically-conductive film. The electric field shielding layer 12 may be made of a material that is less likely to absorb light having a wavelength from about 600 nm to about 1100 nm both inclusive, or of degenerate semiconductor (such as ITO, IZO, and amorphous silicon in which an n-type impurity is dispersed at high concentration ($n^+$-type a-Si)), for example. Generally, in a process of manufacturing a TFT, a technique is used that a defective point in metal wiring patterns (for example, the foregoing wiring patterns WL1 and WL2) is repaired by applying a laser beam thereto in order to improve yields of the TFT. Also, as a display is provided with higher definition, higher accuracy is desired in such a repairing technique. Therefore, a laser light source that outputs a laser beam having a wavelength that is easily absorbed by the metal material is used in the repairing process. Non-limiting examples of such a laser light source may include a short pulse laser having a wavelength of about 1064 nm. In the present example embodiment, the electric field shielding layer 12 may be provided below the TFT layer 14, providing a structure in which the metal wiring patterns and the electric field shielding layer 12 are layered (a structure in which the metal wiring patterns and the electric field shielding layer 12 overlap each other in a plan view) in part or all of a region inside the semiconductor device 10. In this case, it is possible to suppress damage in the electric field shielding layer 12, the insulating film 13, and a region therearound in the repairing process, by using, as the material of the electric field shielding layer 12, a material such as the material that is less likely to absorb light having a wavelength from about 600 nm to about 1100 nm both inclusive, or a degenerate semiconductor.

The present example embodiment also makes it possible to suppress the burning damage caused by the leakage current derived from a defective point in the TFT layer 14, by providing the electric field shielding layer 12 with the sheet resistance of about 1 kΩ or greater. For example, the maximum voltage of 24.5 or greater may be applied to the metal wiring pattern in order to drive the display unit 1 that may be an organic EL display. Moreover, the lamination of the metal wiring pattern and the electric field shielding layer 12 with the insulating film 13 in between causes the laminated part and the surrounding region therearound to receive a high voltage. When the laminated part includes a defect in the formation of the insulating film 13, the metal wiring pattern and the electric field shielding layer 12 may be short-circuited in such a defective point, causing a large leakage current. As a result, the defective point may cause heat generation, which may burn the defective point and the surrounding region therearound. It is possible to suppress such burning damage caused by the leakage current, by providing the electric field shielding layer 12 with the sheet resistance of about 1 kΩ or greater.

The present example embodiment also makes it possible, by supplying the electric field shielding layer 12 with the fixed potential such as the ground potential, to lessen the electrical influence, such as parasitic capacitance, on the TFT 10a, compared to a case where the electric field shielding layer 12 serves as an electrode (a case where the electric field shielding layer 12 receives a signal voltage having a variable voltage value).

As described above, the present example embodiment involves a structure in which the electric field shielding layer 12 is provided on the substrate 11, and the TFT 10a may be provided on the electric field shielding layer 12 with the insulating film 13 in between. In other words, the electric field shielding layer 12 may be provided between the substrate 11 and the TFT 10a. When the gate electrode 143 of the TFT 10a receives a voltage, the electric field generated between the TFT 10a and the substrate 11 may result in variation in the characteristics of the TFT 10a. However, the present example embodiment makes it possible to suppress arrival of the electric field at the substrate 11, by providing the electric field shielding layer 12 between the substrate 11 and the TFT 10a. This makes it possible to suppress the variation in the characteristics of the TFT 10a.

Some example embodiments other than the first example embodiment described above will be described below. Components corresponding to those in the first example embodiment described above will be referred to with the same numerals and will not be further described where appropriate.

Second Example Embodiment

Configuration

Figure 15:
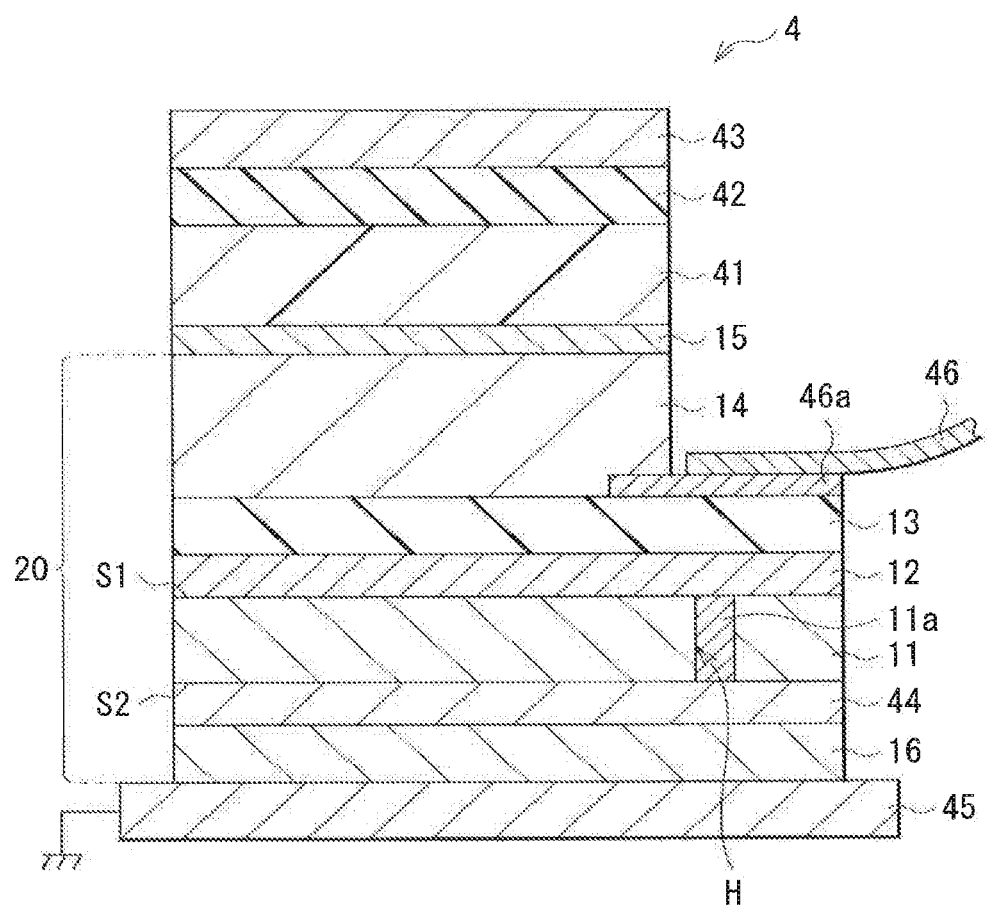
FIG. 15 is a schematic cross-sectional view illustrating an example of an outline configuration of a display unit according to a second example embodiment of the disclosure.

FIG. 15 schematically illustrates a cross-sectional configuration of a display unit (a display unit 4) according to a second example embodiment of the disclosure. As with the display unit 1 according to the first example embodiment described above, the display unit 4 may be, for example, an organic electroluminescent unit, and may include a semiconductor unit 20, and the display element layer 15 provided on the semiconductor device 20. The semiconductor device 20 may serve as a backplane. As with the semiconductor device 10 according to the first example embodiment described above, the semiconductor device 20 includes the substrate 11, and may also include the electric field shielding layer 12, the insulating film 13, and the TFT layer 14 that are provided on the substrate 11 (on a surface S1 of the substrate 11) in order, for example. The metal thin film 16 may be provided on a surface S2 of the substrate 11 (a surface, of the substrate 11, that is opposed to the surface S1 that is closer to the electric field shielding layer 12 than the relevant surface) with an adhesive layer 44 in between. The metal thin film 16 may correspond to a "second electrically-conductive layer" in one specific but non-limiting embodiment of the disclosure. For example, a sealing layer 41, an insulating film 42, and a substrate 43 may be provided in order on the display element layer 15. A wiring pattern layer (a terminal section) 46a may be provided at an end of the insulating film 13. The wiring pattern layer 46a may be coupled to a wiring board such as flexible printed circuits (FPCs), via a cable 46.

The substrate 11 may be a flexible substrate made of a material such as a resin material, as described above, for example. The substrate 11 may have a thickness from about 10 μm to about 200 μm both inclusive, for example. In the present example embodiment, the substrate 11 may have an opening H that penetrates the substrate 11 from the surface S1 to the surface S2. An electrically-conductive layer 11a may be provided inside the opening H (Part or all of the opening H may be filled with the electrically-conductive layer 11a). The electrically-conductive layer 11a may correspond to a "first electrically-conductive layer" in one specific but non-limiting embodiment of the disclosure.

The opening H may be provided in a selected region of the substrate 11. The number of the thus-provided opening H may be one or more. A position to provide the opening H, a shape and a size (the area) of the opening H, and any other factor thereof are not particularly limited; however, the number of openings H to be provided may be preferably two or more in view of improvement in yields. Also, the opening H may be provided by laser processing, for example, which will be described later in detail. Accordingly, the opening H may be preferably provided not in a region corresponding to an effective pixel region of the display element layer 15 but in a region corresponding to a surrounding region therearound in order to suppress influence of heat, which is caused upon laser application, on the pixels, for example.

The opening H may be filled with the electrically-conductive layer 11a. The electrically-conductive layer 11a may contain a material such as silver (Ag). The electrically-conductive layer 11a may be electrically coupled to each of the electric field shielding layer 12 provided on the surface S1 of the substrate 11 and the metal thin film 16 fixed onto the surface S2 of the substrate 11. In the present example embodiment, the electrically-conductive layer 11a may be in contact with each of the electric field shielding layer 12 and the metal thin film 16.

The electric field shielding layer 12 may be provided over the entire surface of the substrate 11 in a continuous form, for example. Also, the electric field shielding layer 12 may have a fixed potential, for example. In the present example embodiment, the electric field shielding layer 12 and the electrically-conductive layer 11a may be electrically isolated from (may not be electrically coupled to) the wiring pattern layer 46a provided on the insulating film 13. The electric field shielding layer 12 may receive the fixed potential (such as a ground potential) via the electrically-conductive layer 11a. The electric field shielding layer 12 may have a thickness from about 5 nm to about 1 μm both inclusive, for example. It is to be noted that the electric field shielding layer 12 may be provided only in a selected region (may be formed into a pattern) as with the foregoing first example embodiment.

The insulating film 13 may include one or both of the inorganic insulating film and the organic insulating film described above. The insulating film 13 may have a thickness from about 50 nm to about 10 μm both inclusive, for example. The insulating film 13 may be provided in a continuous form (may not have any opening) at least in a region that is opposed to the electrically-conductive layer 11a in the present example embodiment.

The sealing layer 41 may serve to protect the display element layer 15. The sealing layer 41 may include a dam member and a resin material, for example. The dam member may be provided in a peripheral portion of the display element layer 15 (in a frame-like shape), for example. A region surrounded by the dam member may be filled with the resin material, for example. It is to be noted that the technique that is used to seal the display element layer 15 is not limited to the foregoing technique. A technique of so-called hollow sealing may be used to seal the display element layer 15, for example.

The insulating film 42 may serve as a protective film. The insulating film 42 may be made of a material similar to that of the insulating film 13, for example. As with the substrate 11 described above, the substrate 43 may be a flexible substrate made of a material such as resin. The adhesive layer 44 may include one of an adhesive agent and an adhesive sheet that have electrical conductivity.

In the present example embodiment, the metal thin film 16 may be fixed onto the surface S2 of the substrate 11 with the adhesive layer 44 in between. As described above, the metal thin film 16 may serve, for example, to protect and reinforce the substrate 11 in a case where the substrate 11 is the flexible substrate or any other substrate. The metal thin film 16 may be coupled to a housing 45 of the display unit 4, for example. The housing 45 may be, for example, a metal member that covers part or all of a rear surface side of the display unit 4 that serves as a module. The housing 45 may be grounded, for example. The shape of the housing 45 is not limited to a box-like shape, and may be a shape such as a plate-like shape and a frame-like shape. In the present example embodiment, illustrated is a structure in which the entire surface of the metal thin film 16 is in contact with the housing 45; however, the structure of the display unit 4 is not limited thereto. Any structure may be employed as long as the metal thin film 16 is electrically coupled to the grounded housing 45. For example, a structure may be employed in which any other electrically-conductive layer is provided between the metal thin film 16 and the housing 45, or only selected part of the metal thin film 16 is in contact with the housing 45.

Manufacturing Method

The foregoing display unit 4 may be manufactured as follows, for example. FIGS. 16A to 23 illustrate a process of manufacturing the display unit 4.

Figure 16A:
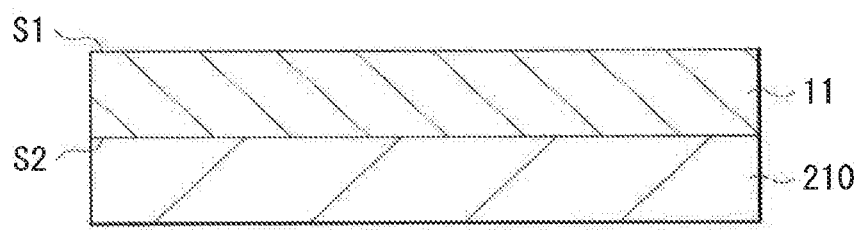
FIG. 16A is a schematic cross-sectional view illustrating an example of a process in a method of manufacturing the display unit illustrated in FIG. 15.
Figure 16B:
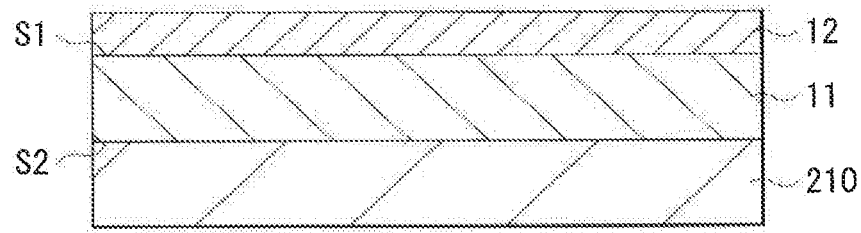
FIG. 16B is a schematic cross-sectional view illustrating an example of a process after the process illustrated in FIG. 16A.
Figure 16C:
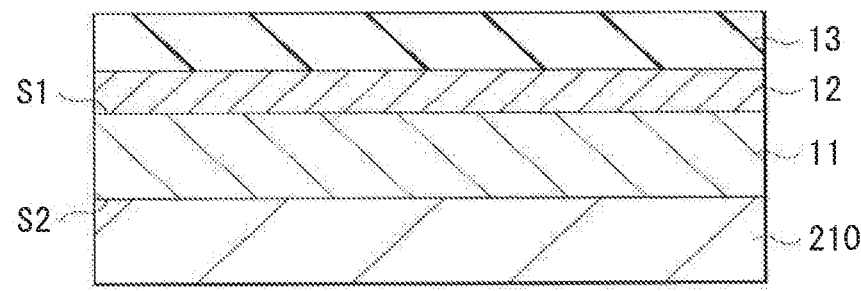
FIG. 16C is a schematic cross-sectional view illustrating an example of a process after the process illustrated in FIG. 16B.
Figure 16D:
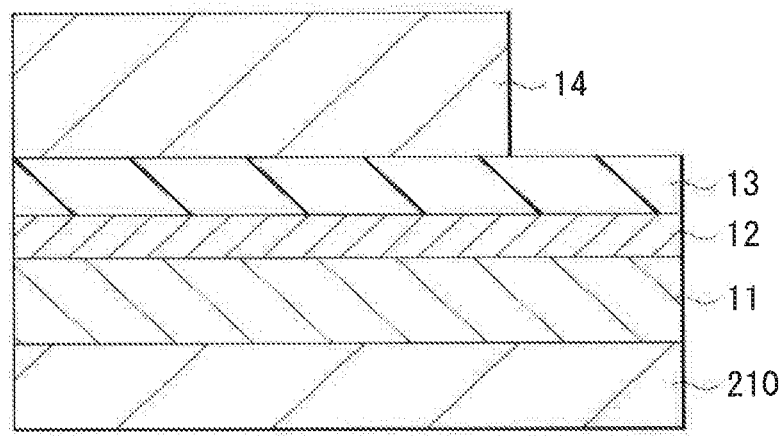
FIG. 16D is a schematic cross-sectional view illustrating an example of a process after the process illustrated in FIG. 16C.

Referring to FIG. 16A, first, the support base 210 made of a material such as glass may be attached onto the back surface (the surface S2) of the substrate 11 that may be, for example, the flexible substrate. Thereafter, referring to FIG. 16B, the electric field shielding layer 12 made of the foregoing material (such as the transparent electrically-conductive film material) may be formed on the surface S1 of the substrate 11 by a technique similar to the foregoing technique used in the first example embodiment. Referring to FIG. 16C, the insulating film 13 made of the foregoing material and having the foregoing thickness may be formed on the electric field shielding layer 12 thereafter. The insulating film 13 may be formed by a technique similar to the foregoing technique used in the first example embodiment, depending on the material of the insulating film 13. Referring to FIG. 16D, the TFT layer 14 may be formed thereafter in a way similar to the foregoing way in the first example embodiment, for example. This may complete the backplane.

Figure 17:
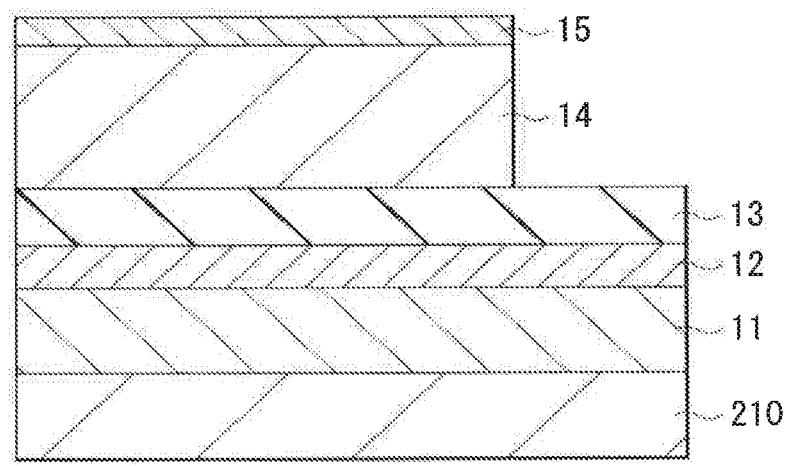
FIG. 17 is a schematic cross-sectional view illustrating an example of a process after the process illustrated in FIG. 16D.

Next, referring to FIG. 17, the display element layer 15 may be formed on the TFT layer 14 in a way similar to that in the first example embodiment described above.

Figure 18A:
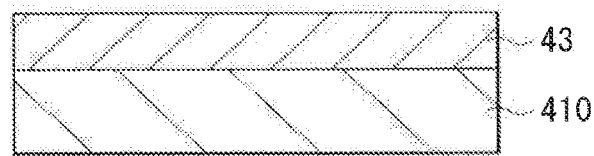
FIG. 18A is a schematic cross-sectional view illustrating an example of another process in the method of manufacturing the display unit illustrated in FIG. 15.
Figure 18B:
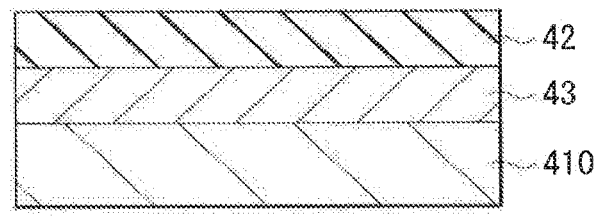
FIG. 18B is a schematic cross-sectional view illustrating an example of a process after the process illustrated in FIG. 18A.

Meanwhile, referring to FIG. 18A, a support base 410 may be attached to a back surface of the substrate 43 that may be the flexible substrate, for example. The support base 410 may be made of a material such as glass. Referring to FIG. 18B, the insulating film 42 may be formed on the substrate 43 thereafter. This may complete a so-called frontplane may be thus formed.

Figure 19:
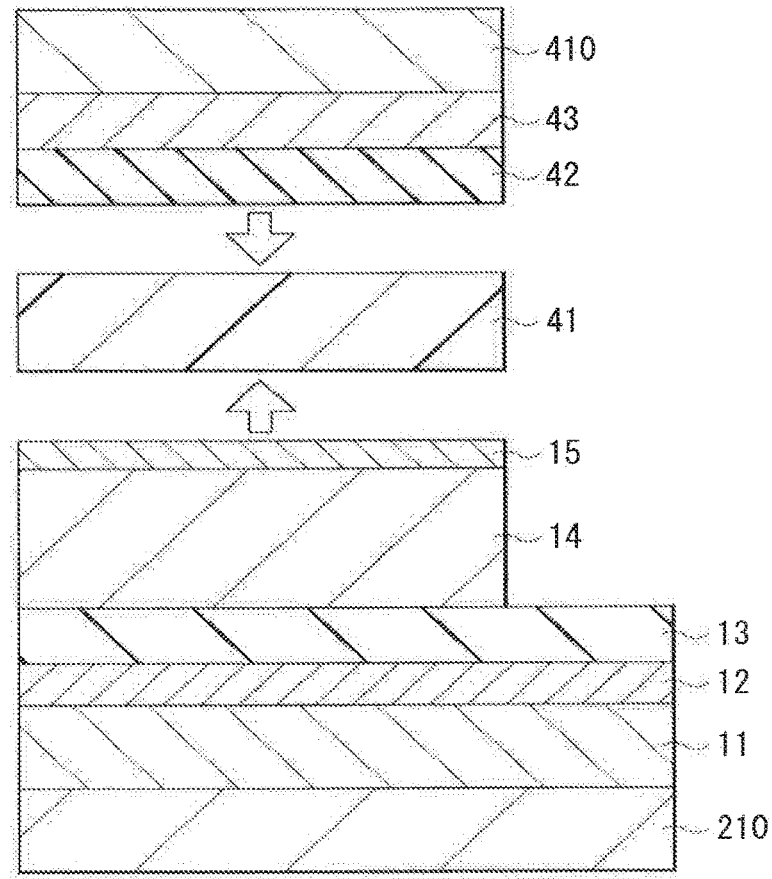
FIG. 19 is a schematic cross-sectional view illustrating an example of another process in the method of manufacturing the display unit illustrated in FIG. 15.

Referring to FIG. 19, the frontplane formed in the process illustrated in FIG. 18B may be attached thereafter onto the display element layer 15 formed in the process illustrated in FIG. 17 with the sealing layer 41 in between. The sealing layer 41 may be formed, for example, by forming the dam member on the peripheral part of the display element layer 15, followed by providing sealing resin into a region surrounded by the dam member and curing the provided sealing resin.

Figure 20:
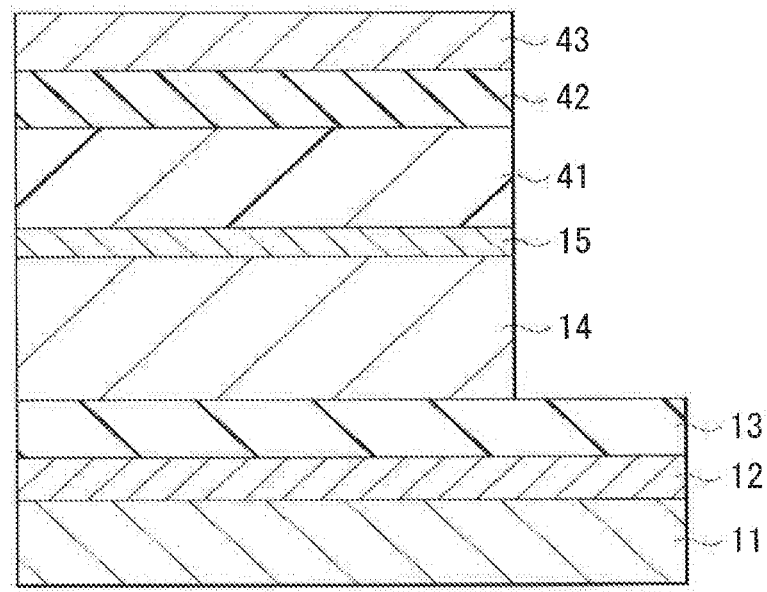
FIG. 20 is a schematic cross-sectional view illustrating an example of a process after the process illustrated in FIG. 19.

Referring to FIG. 20, the support bases 210 and 410 may be removed thereafter from the substrates 11 and 43, respectively.

Figure 21:
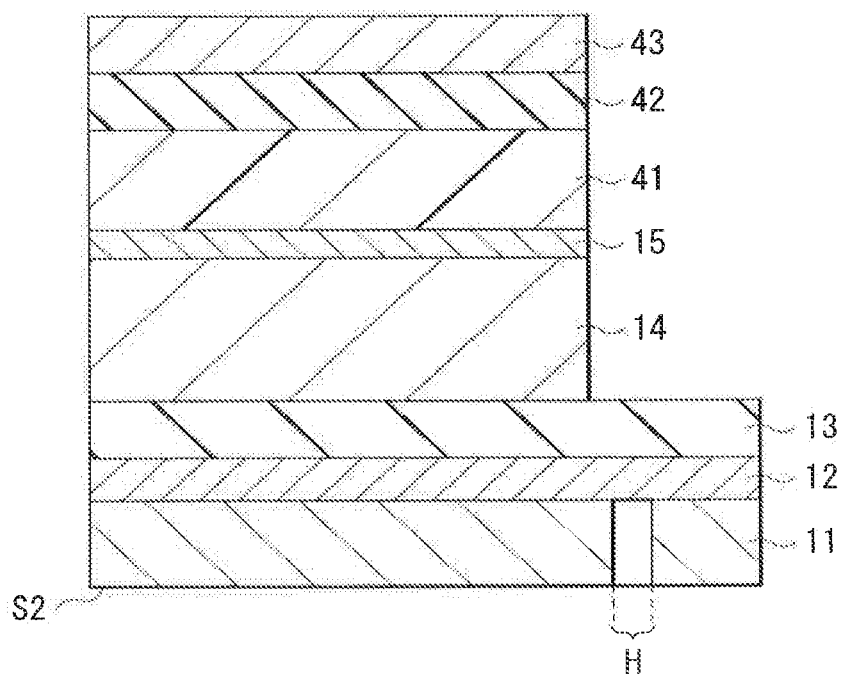
FIG. 21 is a schematic cross-sectional view illustrating an example of a process after the process illustrated in FIG. 20.

Referring to FIG. 21, the opening H may be provided in the substrate 11 thereafter. More specifically, the substrate 11 may be processed from the surface S2 side thereof by applying a laser beam to the substrate 11. Upon the applying of the laser beam, a laser such as an excimer laser or a solid-state laser may be used, and various conditions, of the laser beam, such as a wavelength and an output may be set appropriately. Upon the processing of the substrate 11, it is preferable that energy derived from the laser beam be selectively absorbed by the substrate 11. This may be achieved, for example, by setting the various conditions, of the laser beam, such as the wavelength and the output so as to prevent the laser beam from being absorbed by the insulating film 13, the TFT layer 14, and the display element layer 15 when the laser beam passes through those layers. Alternatively, this may be achieved, for example, by so setting conditions of applying the laser beam as to cause the laser beam to be reflected and not to be incident on the insulating film 13, the TFT layer 14, and the display element layer 15.

Figure 22:
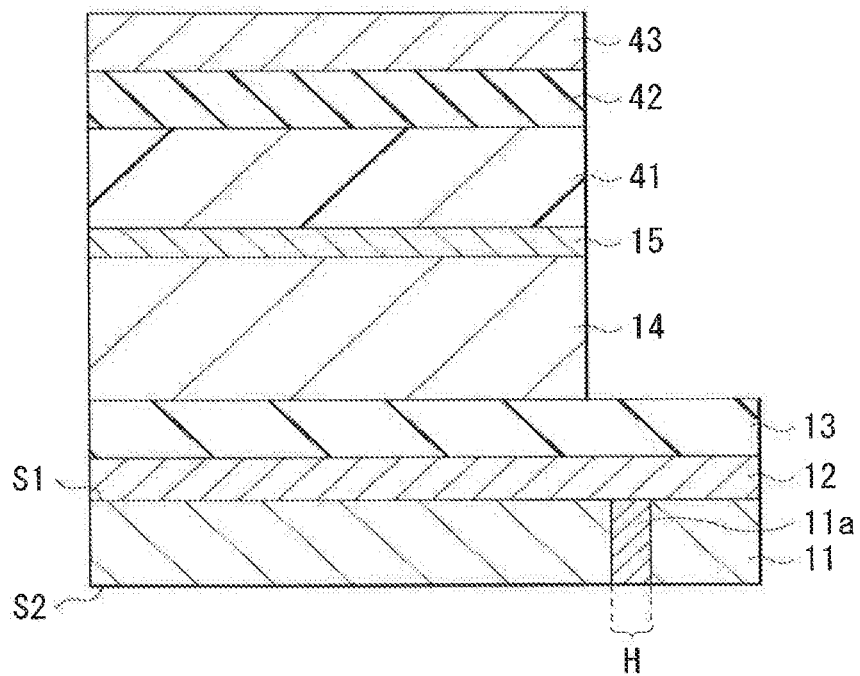
FIG. 22 is a schematic cross-sectional view illustrating an example of a process after the process illustrated in FIG. 21.

Referring to FIG. 22, part or all of the inside of the opening H in the substrate 11 may be filled thereafter with a conductive material such as silver paste to form the electrically-conductive layer 11a.

Figure 23:
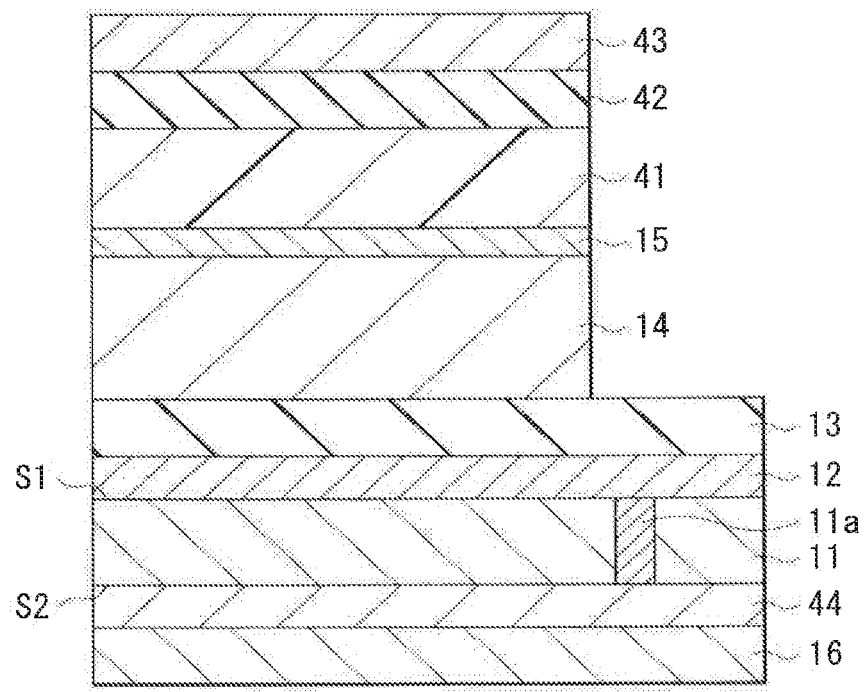
FIG. 23 is a schematic cross-sectional view illustrating an example of a process after the process illustrated in FIG. 22.

Referring to FIG. 23, the metal thin film 16 may be fixed thereafter to (attached onto) the surface S2 of the substrate 11 with the adhesive layer 44 in between. Thereafter, the metal thin film 16 may be coupled to the housing 45, which is not particularly illustrated. Also, in a process after the forming of the insulating film 13, a component such as a wiring board may be coupled to the end of the insulating film 13 with the cable 46 in between. This may complete the display unit 4 illustrated in FIG. 15.

Actions and Effects

Also in the display unit 4 according to the second example embodiment, the respective pixels in the display element layer 15 may be driven, to perform display, based on an image signal that may be supplied from outside, thus performing image display, as with the display unit 1 according to the foregoing first example embodiment. Also, the TFT layer 14 in the semiconductor device 20 may receive a voltage to drive the pixels.

Also in the second example embodiment, when the substrate 11 is the flexible substrate made of a material such as resin, for example, an electric field may be generated between the TFT layer 14 and the substrate 11, and an electric charge may occur on the back surface (the surface S2) of the substrate 11 and inside of the substrate 11. The electric field shielding layer 12, however, is provided as with the first example embodiment described above, which suppresses the foregoing influence of the electric field and thereby suppresses the variation in the characteristics of the TFT layer 14. Accordingly, it is possible to achieve effects equivalent to those achieved in the first example embodiment described above.

Figure 24:
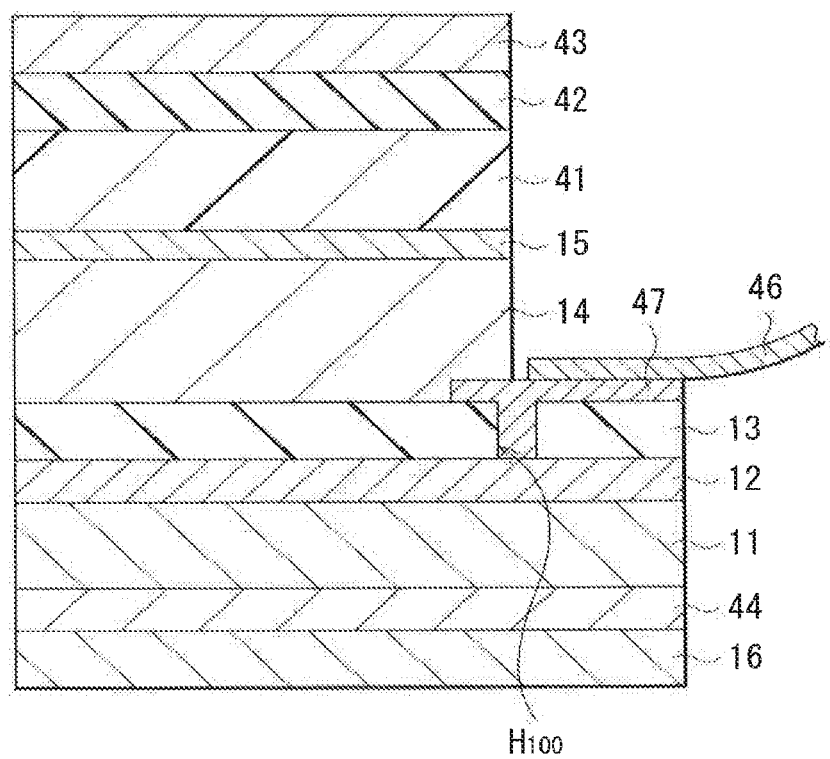
FIG. 24 is a schematic cross-sectional view illustrating a configuration of a display unit according to Comparative example 2.

In addition thereto, the present example embodiment makes it possible to achieve the following effects. FIG. 24 illustrates a configuration of a display unit according to a comparative example (Comparative example 2) of the second example embodiment. In the case where the electric field shielding layer 12 is provided between the substrate 11 and the TFT layer 14, the electric field shielding layer 12 may preferably have the fixed potential (such as the ground potential) rather than being electrically floated. In this view point, Comparative example 2 has a structure in which an opening $H_{100}$ is provided in the insulating film 13 on the electric field shielding layer 12, and a wiring pattern layer 47 is so provided that the opening $H_{100}$ is filled with the wiring pattern layer 47. The wiring pattern layer 47 is drawn out onto the insulating film 13 and is coupled to a component such as a wiring board via the cable 46. To supply the fixed potential to the electric field shielding layer 12, the wiring pattern layer 47 that penetrates the insulating film 13 is provided in Comparative example 2.

The unit configuration of Comparative example 2 involves processing of the insulating film 13 (provision of the opening $H_{100}$) using a technique such as photolithography to provide the wiring pattern layer 47. This results in an increase in the number of processes for the processing using photolithography, and may also require using a photosensitive material to provide the insulating film 13. Moreover, the unit configuration involves difficulty in increasing the thickness of the insulating film 13 due to necessity of so providing the wiring pattern layer 47 that the opening $H_{100}$ is filled with the wiring pattern layer 47. Such difficulty in providing the insulating film 13 with enough thickness and the provision of the opening $H_{100}$ may result in a decrease in barrier characteristics against moisture, movable ions, etc.

The second example embodiment addresses such concerns by providing the opening (the opening H) not in the insulating film 13 but in the substrate 11, and providing the electrically-conductive layer 11a in part or all of the inside of the opening H, as illustrated in FIG. 15. In other words, the electrically-conductive layer 11a (and the electric field shielding layer 12, accordingly) may be electrically isolated from the wiring pattern layer 46a provided on the insulating film 13, making it possible to supply the fixed potential to the electric field shielding layer 12 with the use of the electrically-conductive layer 11a. This makes it possible to achieve the above-described electric field shielding effect while suppressing the decrease in the barrier characteristics of the insulating film 13. It also makes it possible to use any material for the insulating film 13 without limiting the material for the insulating film 13 to a photosensitive material. It also makes it possible to reduce the number of the processes of photolithography, because it eliminates the necessity of processing the insulating film 13. It also makes it possible to increase the thickness of the insulating film 13 in order to secure the barrier characteristics, in order to reduce capacity, or for any other purpose, because it eliminates any limitation in the thickness of the insulating film 13. As described above, the second example embodiment makes it possible to increase variations of the material selected for the insulating film 13, of the manufacturing process, etc.

Also, the second example embodiment involves a structure in which the metal thin film 16 may be fixed onto the surface S2 of the substrate 11 with the adhesive layer 44 having electrical conductivity in between, and thus-provided metal thin film 16 may be coupled to the grounded housing 45. This allows the electrically-conductive layer 11a to have the ground potential via the adhesive layer 44, the metal thin film 16, and the housing 45. As a result, it is possible to achieve less variation in potential and more-stable potential supply as compared to those in a case where the fixed potential is supplied via a wiring board such as printed circuits.

Functional Configuration Example

Figure 25:
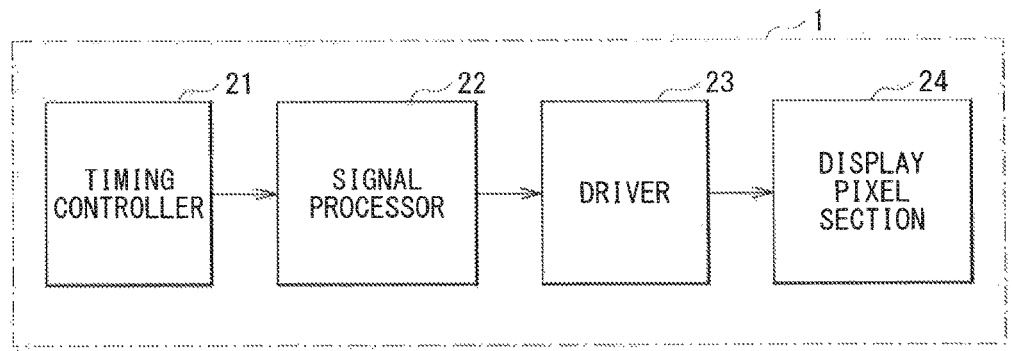
FIG. 25 is a block diagram illustrating an example of a functional configuration of a display unit.

FIG. 25 illustrates a functional block configuration of the display units 1 and 4 (for the sake of convenience, hereinafter, collectively referred to as "display unit 1") in the example embodiments described above.

The display unit 1 may display an image based on an image signal that is supplied from outside or generated inside the display unit 1. The display unit 1 may also be applied, besides the organic EL display described above, to any other display such as a liquid crystal display. The display unit 1 may include a timing controller 21, a signal processor 22, a driver 23, and a display pixel section 24, for example.

The timing controller 21 may include a timing generator that generates various timing signals (control signals). The timing controller 21 may perform drive control on components such as the signal processor 22, based on the generated various timing signals. The signal processor 22 may perform predetermined correction on the digital image signal supplied from the outside, and supply the corrected image signal to the driver 23, for example. The driver 23 may include circuits such as a scanning line driver circuit and a signal line driver circuit, for example. The driver 23 may drive the respective pixels in the display pixel section 24 via various control lines. The display pixel section 24 may include display elements (the foregoing display element layer 15) and a pixel circuit that serves to drive the display elements on a pixel-by-pixel basis. The display elements may each be such an element such as an organic EL element and a liquid crystal display element. The semiconductor device 10 including the TFT 10a described above may be applied, for example, to various circuits that configure part of the driver 23 or the display pixel section 24, out of the components described above.

Application Examples Other than Display Unit

Figure 26:
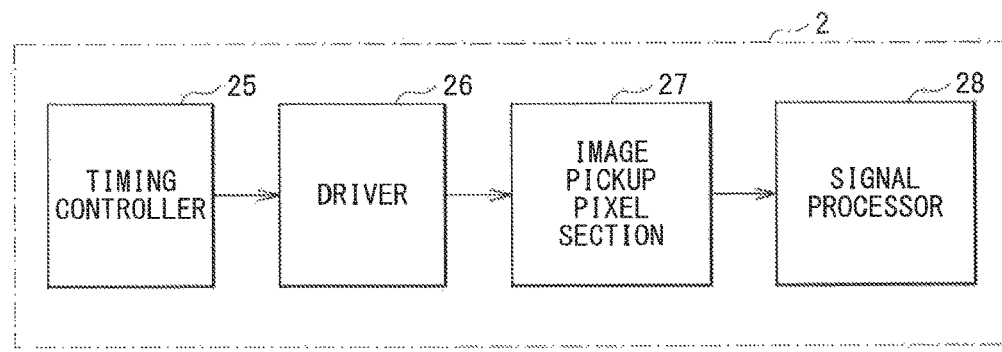
FIG. 26 is a block diagram illustrating an example of a configuration of an image pickup unit.

The description above related to the first and second example embodiment refers to an application example in which the semiconductor devices 10 and 20 (for the sake of convenience, hereinafter, collectively referred to as "semiconductor device 10") are applied to the display unit 1. However, the semiconductor device 10 described above may also be applied to any unit other than the display unit 1, such as an image pickup unit (an image pickup unit 2) illustrated in FIG. 26.

The image pickup unit 2 may be a solid-state image pickup unit that acquires an image as an electric signal, for example. The image pickup unit 2 may include, for example, a charge coupled device (CCD) image sensor, a complementary metal oxide semiconductor (CMOS) image sensor, or any other device that allows for imaging. The image pickup unit 2 may include a timing controller 25, a driver 26, an image pickup pixel section 27, and a signal processor 28, for example.

The timing controller 25 may include a timing generator that generates various timing signals (control signals). The timing controller 25 may perform drive control on the driver 26, based on the various timing signals. The driver 26 may include devices such as a row selector circuit, an analog-to-digital (A-D) converter circuit, and a horizontal transmission scanner circuit. The driver 26 may drive the image pickup pixel section 27 via various control lines so as to cause the image pickup pixel section 27 to read a signal out from each of the pixels. The image pickup pixel section 27 may include, for example, an image pickup element (a photoelectric conversion element) such as a photodiode, and a pixel circuit that may serve to read out the signal. The signal processor 28 may perform various signal processings on the signal acquired in the image pickup pixel section 27. The semiconductor device 10 that may include the TFT 10a described above may be applied, for example, to various circuits that configure part of the driver 26 or the image pickup pixel section 27.

Examples of Electronic Apparatus

Figure 27:
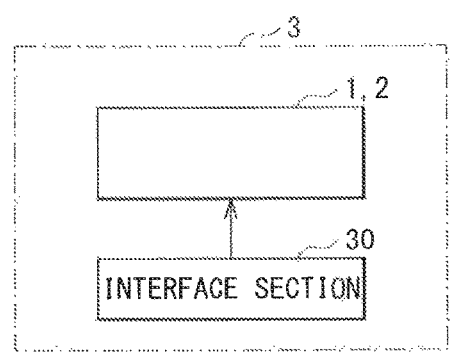
FIG. 27 is a block diagram illustrating an example of a configuration of an electronic apparatus.

The display unit 1 (or the image pickup unit 2) that includes the semiconductor device 10 described in the foregoing example embodiments and their modification examples may be applied to various types of electronic apparatuses. FIG. 27 illustrates a functional block configuration of an electronic apparatus 3. Non-limiting examples of the electronic apparatus 3 may include a television apparatus, a personal computer (PC), a smartphone, a tablet PC, a mobile phone, a digital still camera, and a digital video camera.

The electronic apparatus 3 may include, for example, the display unit 1 (or the image pickup unit 2) described above and an interface section 30. The interface section 30 may be an input section that receives various signals supplied from outside and power from a power source. The interface section 30 may include, for example, a user interface such as a touch panel, a key board, and operation buttons.

The disclosure has been described hereinabove referring to some example embodiments, etc., but is not limited thereto, and may be variously modified. For example, the material and the thickness of each of the layers are not limited to those described above in the example embodiments, etc., and may be any other material and thickness. Moreover, the thin film transistor and the semiconductor device may not necessarily include all of the layers described above, and may further include other layers in addition to the layers described above.

Figure 28:
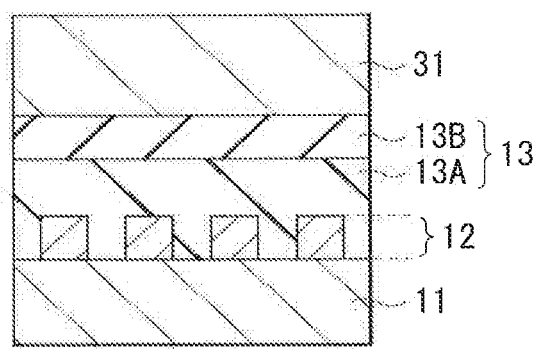
FIG. 28 is a schematic cross-sectional view illustrating an example of a configuration of another semiconductor device.

The example embodiments, etc. described above refer, as examples, to the semiconductor devices 10 and 20 that include the TFT 10a (the TFT layer 14). However, the semiconductor device according to the disclosure may include a semiconductor element 31 other than the TFT 10a, as illustrated in FIG. 28. The semiconductor element 31 may be provided on the substrate 11 with the electric field shielding layer 12 and the insulating film 13 in between, for example. The semiconductor element 31 may be, for example, a semiconductor element of any type that includes an electrode such as a capacitor or a photoelectric conversion element. Any of the foregoing structure makes it difficult for the electric field to arrive at the substrate 11 from the semiconductor element 31, making it possible to suppress variation in characteristics of the semiconductor element 31.

Moreover, the effects described above in the example embodiments, etc. are mere examples, and the effects of the disclosure may be other effects, or may further include other effects in addition to the effects described above.

It is possible to achieve at least the following configurations from the foregoing example embodiments and the modification examples of the disclosure.

(1) A semiconductor device, including:
    a substrate;
    an electric field shielding layer provided on the substrate; and
    a semiconductor element including an electrode, and provided on the electric field shielding layer with an insulating film in between.

(2) The semiconductor device according to (1), wherein
the semiconductor element includes a semiconductor
layer provided in a selected region on the substrate,
and
the electric field shielding layer has a shape in which
part or all of the electric field shielding layer overlaps the semiconductor layer in a plan view.
(3) The semiconductor device according to (2), wherein
the semiconductor element is a thin film transistor that
includes the semiconductor layer on the substrate,
the electric field shielding layer includes an island part
and a wiring pattern part, the island part overlapping
the semiconductor layer of the thin film transistor in
the plan view, and the wiring pattern part being
electrically coupled to the island part.
(4) The semiconductor device according to any one of (1)
to (3), wherein the electric field shielding layer has a
fixed potential.
(5) The semiconductor device according to (4), further
including a first electrically-conductive layer, wherein
the substrate has a first surface, a second surface, and
one or a plurality of openings, the first surface being
provided closer to the electric field shielding layer
than the second surface, the second surface being
opposed to the first surface, and the one or the
plurality of openings penetrating the substrate from
the first surface to the second surface, and
the first electrically-conductive layer is provided inside
the one or the plurality of openings.
(6) The semiconductor device according to (5), further
including a second electrically-conductive layer fixed
onto the second surface of the substrate with an electrically-conductive adhesive layer in between.
(7) The semiconductor device according to (6), wherein
the second electrically-conductive layer is coupled to a
grounded housing.
(8) The semiconductor device according to any one of (5)
to (7), further including a wiring pattern layer provided
on the insulating film, wherein
the first electrically-conductive layer is electrically
isolated from the wiring pattern layer provided on
the insulating film.
(9) The semiconductor device according to any one of (5)
to (8), wherein the insulating film is provided in a
continuous form at least in a region that is opposed to
the first electrically-conductive layer.
(10) The semiconductor device according to any one of
(1) to (9), wherein the electric field shielding layer is
provided in a continuous form over an entire surface of
the substrate.
(11) The semiconductor device according to any one of
(1) to (10), wherein the electric field shielding layer
includes a transparent electrically-conductive film.
(12) The semiconductor device according to any one of
(1) to (11), wherein the substrate is a flexible substrate.
(13) The semiconductor device according to (12), wherein
the substrate contains resin.
(14) A display unit, including:
a substrate;
an electric field shielding layer provided on the substrate;
a semiconductor element including an electrode, and
provided on the electric field shielding layer with an
insulating film in between; and
a display element layer including a plurality of pixels,
and provided on the semiconductor element.
(15) The display unit according to (14), wherein the
electric field shielding layer has a fixed potential.
(16) The display unit according to (15), further including
a first terminal section, wherein
the display element layer includes a plurality of first
electrodes, a display function layer, and a second
electrode, the plurality of first electrodes each being
disposed for corresponding one of the pixels, the
display function layer being provided on the plurality
of first electrodes, and the second electrode being
provided on the plurality of first electrodes and
receiving a first fixed potential,
the first terminal section is provided on an end of the
substrate, and supplies the first fixed potential to the
second electrode, and
the electric field shielding layer is electrically coupled
to the first terminal section.
(17) The display unit according to (15), further including
a first terminal section and a second terminal section,
wherein
the display element layer includes a plurality of first
electrodes, a display function layer, and a second
electrode, the plurality of first electrodes each being
disposed for corresponding one of the pixels, the
display function layer being provided on the plurality
of first electrodes, and the second electrode being
provided on the plurality of first electrodes and
having a first fixed potential,
the first terminal section is provided on an end of the
substrate, and supplies the first fixed potential to the
second electrode,
the second terminal section is provided on the end of
the substrate, and supplies a second fixed potential
that is different from the first fixed potential supplied
by the first terminal section, and
the electric field shielding layer is electrically coupled
to the second terminal section.
(18) The display unit according to (15), further including
a first electrically-conductive layer, wherein
the substrate has a first surface, a second surface, and
one or a plurality of openings, the first surface being
provided closer to the electric field shielding layer
than the second surface, the second surface being
opposed to the first surface, and the one or the
plurality of openings penetrating the substrate from
the first surface to the second surface, and
the first electrically-conductive layer is provided inside
the one or the plurality of openings.
(19) A method of manufacturing a display unit, the
method including:
forming an electric field shielding layer on a substrate;
forming a semiconductor element on the electric field
shielding layer with an insulating film in between,
the semiconductor element including an electrode;
and
forming a display element layer on the semiconductor
element, the display element layer including a plurality of pixels.
(20) An electronic apparatus with a display unit, the
display unit including:
a substrate;
an electric field shielding layer provided on the substrate;
a semiconductor element including an electrode, and
provided on the electric field shielding layer with an
insulating film in between; and a display element layer including a plurality of pixels, and provided on the semiconductor element.

Although the disclosure has been described in terms of exemplary embodiments, it is not limited thereto. It should be appreciated that variations may be made in the described embodiments by persons skilled in the art without departing from the scope of the invention as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" or "approximately" as used herein can allow for a degree of variability in a value or range. Moreover, no element or component in this disclosure is intended to be dedicated to the public regardless of whether the element or component is explicitly recited in the following claims.

What is claimed is:

1. A semiconductor device, comprising:
a substrate;
an electric field shielding layer provided on the substrate; and
a semiconductor element including an electrode, and provided on the electric field shielding layer with an insulating film in between;
wherein
the semiconductor element includes a semiconductor layer provided in a selected region on the substrate,
the electric field shielding layer has a shape in which part or all of the electric field shielding layer overlaps the semiconductor layer in a plan view,
the semiconductor element is a thin film transistor that includes the semiconductor layer on the substrate, and
the electric field shielding layer includes an island part and a wiring pattern part, the island part overlapping the semiconductor layer of the thin film transistor in the plan view, and the wiring pattern part being electrically coupled to the island part.

2. A semiconductor device, comprising:
a substrate;
an electric field shielding layer provided on the substrate;
a semiconductor element including an electrode, and provided on the electric field shielding layer with an insulating film in between; and
a first electrically-conductive layer,
wherein
the electric field shielding layer has a fixed potential,
the substrate has a first surface, a second surface, and one or a plurality of openings, the first surface being provided closer to the electric field shielding layer than the second surface, the second surface being opposed to the first surface, and the one or the plurality of openings penetrating the substrate from the first surface to the second surface, and
the first electrically-conductive layer is provided inside the one or the plurality of openings.

3. The semiconductor device according to claim 2, further comprising a second electrically-conductive layer fixed onto the second surface of the substrate with an electrically-conductive adhesive layer in between.

4. The semiconductor device according to claim 3, wherein the second electrically-conductive layer is coupled to a grounded housing.

5. The semiconductor device according to claim 2, further comprising a wiring pattern layer provided on the insulating film, wherein
the first electrically-conductive layer is electrically isolated from the wiring pattern layer provided on the insulating film.

6. The semiconductor device according to claim 2, wherein the insulating film is provided in a continuous form at least in a region that is opposed to the first electrically-conductive layer.

7. The semiconductor device according to claim 2, wherein the electric field shielding layer is provided in a continuous form over an entire surface of the substrate.

8. The semiconductor device according to claim 2, wherein the electric field shielding layer includes a transparent electrically-conductive film.

9. The semiconductor device according to claim 2, wherein the substrate is a flexible substrate.

10. The semiconductor device according to claim 9, wherein the substrate contains resin.

11. A display unit, comprising:
a substrate;
an electric field shielding layer provided on the substrate;
a semiconductor element including an electrode, and provided on the electric field shielding layer with an insulating film in between;
a display element layer including a plurality of pixels, and provided on the semiconductor element; and
a first terminal section,
wherein
the electric field shielding layer has a fixed potential,
the display element layer includes a plurality of first electrodes, a display function layer, and a second electrode, the plurality of first electrodes each being disposed for corresponding one of the pixels, the display function layer being provided on the plurality of first electrodes, and the second electrode being provided on the plurality of first electrodes and receiving a first fixed potential,
the first terminal section is provided on an end of the substrate, and supplies the first fixed potential to the second electrode, and
the electric field shielding layer is electrically coupled to the first terminal section.

12. A display unit, comprising:
a substrate;
an electric field shielding layer provided on the substrate;
a semiconductor element including an electrode, and provided on the electric field shielding layer with an insulating film in between;
a display element layer including a plurality of pixels, and provided on the semiconductor element;
a first terminal section; and
a second terminal section,
wherein
the electric field shielding layer has a fixed potential,
the display element layer includes a plurality of first electrodes, a display function layer, and a second electrode, the plurality of first electrodes each being disposed for corresponding one of the pixels, the display function layer being provided on the plurality of first electrodes, and the second electrode being provided on the plurality of first electrodes and having a first fixed potential, the first terminal section is provided on an end of the substrate, and supplies the first fixed potential to the second electrode, the second terminal section is provided on the end of the substrate, and supplies a second fixed potential that is different from the first fixed potential supplied by the first terminal section, and the electric field shielding layer is electrically coupled to the second terminal section.

13. A display unit, comprising:

a substrate;

an electric field shielding layer provided on the substrate;

a semiconductor element including an electrode, and provided on the electric field shielding layer with an insulating film in between;

a display element layer including a plurality of pixels, and provided on the semiconductor element; and a first electrically-conductive layer, wherein the electric field shielding layer has a fixed potential, the substrate has a first surface, a second surface, and one or a plurality of openings, the first surface being provided closer to the electric field shielding layer than the second surface, the second surface being opposed to the first surface, and the one or the plurality of openings penetrating the substrate from the first surface to the second surface, and the first electrically-conductive layer is provided inside the one or the plurality of openings.

14. A method of manufacturing a display unit, the method comprising:

forming an electric field shielding layer on a substrate;

forming a semiconductor element on the electric field shielding layer with an insulating film in between, the semiconductor element including an electrode;

forming a display element layer on the semiconductor element, the display element layer including a plurality of pixels; and forming a first terminal section, wherein the electric field shielding layer has a fixed potential, the display element layer includes a plurality of first electrodes, a display function layer, and a second electrode, the plurality of first electrodes each being disposed for corresponding one of the pixels, the display function layer being provided on the plurality of first electrodes, and the second electrode being provided on the plurality of first electrodes and receiving a first fixed potential, the first terminal section is provided on an end of the substrate, and supplies the first fixed potential to the second electrode, and the electric field shielding layer is electrically coupled to the first terminal section.

15. An electronic apparatus with a display unit, the display unit comprising:

a substrate;

an electric field shielding layer provided on the substrate;

a semiconductor element including an electrode, and provided on the electric field shielding layer with an insulating film in between;

a display element layer including a plurality of pixels, and provided on the semiconductor element; and a first terminal section, wherein the electric field shielding layer has a fixed potential, the display element layer includes a plurality of first electrodes, a display function layer, and a second electrode, the plurality of first electrodes each being disposed for corresponding one of the pixels, the display function layer being provided on the plurality of first electrodes, and the second electrode being provided on the plurality of first electrodes and receiving a first fixed potential, the first terminal section is provided on an end of the substrate, and supplies the first fixed potential to the second electrode, and the electric field shielding layer is electrically coupled to the first terminal section.

\* \* \* \* \*